(12) United States Patent
Chen et al.

(10) Patent No.: US 10,242,143 B2
(45) Date of Patent: Mar. 26, 2019

(54) RADIO FREQUENCY ISOLATION STRUCTURE WITH RACETRACK

(71) Applicant: Skyworks Solutions, Inc., Woburn, MA (US)

(72) Inventors: Howard E. Chen, Anaheim, CA (US); Matthew Sean Read, Rancho Santa Margarita, CA (US); Hoang Mong Nguyen, Fountain Valley, CA (US); Anthony James LoBianco, Irvine, CA (US); Guohao Zhang, Nanjing (CN); Dinhphuoc Vu Hoang, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/046,258

(22) Filed: Feb. 17, 2016

(65) Prior Publication Data
US 2016/0163661 A1 Jun. 9, 2016

Related U.S. Application Data

(62) Division of application No. 13/939,066, filed on Jul. 10, 2013, now Pat. No. 9,295,157.
(Continued)

(51) Int. Cl.
*G06F 17/50* (2006.01)
*H05K 1/18* (2006.01)
(Continued)

(52) U.S. Cl.
CPC ........ *G06F 17/5072* (2013.01); *H01L 21/561* (2013.01); *H01L 23/49827* (2013.01);
(Continued)

(58) Field of Classification Search
CPC ....... H01L 21/561; H01L 23/31; H01L 23/66; H01L 23/552; G06F 17/50; G06F 17/5072
(Continued)

(56) References Cited

U.S. PATENT DOCUMENTS

| 3,816,911 A | 6/1974 | Knappenberger |
| 4,151,637 A | 5/1979 | Zemek et al. |

(Continued)

FOREIGN PATENT DOCUMENTS

| CN | 101593745 | 12/2009 |
| CN | 101673733 | 3/2010 |

(Continued)

OTHER PUBLICATIONS

International Search Report and Written Opinion dated Oct. 22, 2013 for International Application No. PCT/US2013/049977 filed Jul. 10, 2013. 10 pages.

*Primary Examiner* — Xiaoliang Chen
(74) *Attorney, Agent, or Firm* — Knobbe Martens Olson & Bear, LLP

(57) ABSTRACT

Aspects of the present disclosure relate to a racetrack that forms part of an RF isolation structure of a packaged module and wireless devices that include such a packaged module. The racetrack can be disposed in a substrate and around an RF component that is on the substrate. The racetrack can include at least one break and/or at least one narrowed section without significantly degrading the EMI performance of the RF isolation structure.

20 Claims, 20 Drawing Sheets

Related U.S. Application Data

(60) Provisional application No. 61/671,594, filed on Jul. 13, 2012.

(51) Int. Cl.
| | |
|---|---|
| *H01L 23/552* | (2006.01) |
| *H01L 21/56* | (2006.01) |
| *H01L 23/00* | (2006.01) |
| *H01L 23/498* | (2006.01) |
| *H01L 23/58* | (2006.01) |
| *H01L 23/66* | (2006.01) |

(52) U.S. Cl.
CPC ...... *H01L 23/49838* (2013.01); *H01L 23/552* (2013.01); *H01L 23/585* (2013.01); *H01L 23/66* (2013.01); *H01L 24/49* (2013.01); *H01L 24/97* (2013.01); *H05K 1/181* (2013.01); *H01L 24/48* (2013.01); *H01L 24/73* (2013.01); *H01L 2223/6611* (2013.01); *H01L 2223/6616* (2013.01); *H01L 2223/6644* (2013.01); *H01L 2223/6677* (2013.01); *H01L 2224/32225* (2013.01); *H01L 2224/48227* (2013.01); *H01L 2224/73265* (2013.01); *H01L 2224/85* (2013.01); *H01L 2224/92247* (2013.01); *H01L 2224/97* (2013.01); *H01L 2924/00014* (2013.01); *H01L 2924/1531* (2013.01); *H01L 2924/181* (2013.01); *H01L 2924/19105* (2013.01); *H01L 2924/19107* (2013.01); *H01L 2924/3025* (2013.01); *H01L 2924/30107* (2013.01)

(58) Field of Classification Search
USPC ........ 361/760, 704; 257/508, 659, 660, 774; 455/334
See application file for complete search history.

(56) References Cited

U.S. PATENT DOCUMENTS

| | | | |
|---|---|---|---|
| 4,168,507 A | 9/1979 | Yester, Jr. | |
| 4,241,497 A | 12/1980 | Du Bois | |
| 4,245,385 A | 1/1981 | Zemek et al. | |
| 4,447,945 A | 5/1984 | Priscsak | |
| 4,724,613 A | 2/1988 | Dale | |
| 4,857,483 A | 8/1989 | Steffen et al. | |
| 5,057,798 A | 10/1991 | Moye et al. | |
| 5,151,770 A | 9/1992 | Inoue | |
| 5,166,772 A | 11/1992 | Soldner et al. | |
| 5,166,864 A | 11/1992 | Chitwood | |
| 5,206,712 A | 4/1993 | Kornrumpf et al. | |
| 5,355,016 A | 10/1994 | Swirbel | |
| 5,355,102 A | 10/1994 | Kornrumpf et al. | |
| 5,428,508 A | 6/1995 | Pronto | |
| 5,448,826 A | 9/1995 | Goetz et al. | |
| 5,602,421 A * | 2/1997 | Li | H01L 23/057 |
| | | | 257/664 |
| 5,603,103 A | 2/1997 | Halttunen et al. | |
| 5,736,783 A | 4/1998 | Wein et al. | |
| 5,753,972 A | 5/1998 | Wein et al. | |
| 5,872,393 A | 2/1999 | Sakai et al. | |
| 5,940,964 A | 8/1999 | Mugiya | |
| 6,058,497 A | 5/2000 | Tuttle | |
| 6,137,693 A | 10/2000 | Schwiebert et al. | |
| 6,172,412 B1 | 1/2001 | Wein et al. | |
| 6,192,577 B1 | 2/2001 | Larsson | |
| 6,202,294 B1 | 3/2001 | Bogannam | |
| 6,333,552 B1 | 12/2001 | Kakimoto et al. | |
| 6,335,669 B1 | 1/2002 | Miyazaki et al. | |
| 6,350,951 B1 | 2/2002 | Askew | |
| 6,377,464 B1 | 4/2002 | Hashemi et al. | |
| 6,426,881 B1 | 7/2002 | Kurz | |
| 6,449,828 B2 | 9/2002 | Pahl et al. | |
| 6,462,436 B1 | 10/2002 | Kay et al. | |
| 6,472,724 B1 | 10/2002 | Matsuzawa et al. | |
| 6,486,549 B1 | 11/2002 | Chiang | |
| 6,566,596 B1 | 5/2003 | Askew | |
| 6,601,293 B1 | 8/2003 | Glenn | |
| 6,632,029 B1 | 10/2003 | Williamson et al. | |
| 6,650,009 B2 | 11/2003 | Her | |
| 6,809,255 B1 | 10/2004 | Chun | |
| 6,855,893 B2 | 1/2005 | Kumakura et al. | |
| 6,865,084 B2 * | 3/2005 | Lin | H01L 23/3128 |
| | | | 165/80.2 |
| 6,947,295 B2 | 9/2005 | Hsieh | |
| 6,974,724 B2 | 12/2005 | Hyvonen et al. | |
| 6,994,901 B1 | 2/2006 | Chen et al. | |
| 7,030,469 B2 | 4/2006 | Mahadevan et al. | |
| 7,088,009 B2 | 8/2006 | Hagen | |
| 7,148,965 B2 | 12/2006 | Nishimura et al. | |
| 7,151,011 B2 | 12/2006 | Sridharan et al. | |
| 7,198,987 B1 | 4/2007 | Warren et al. | |
| 7,667,302 B1 * | 2/2010 | Chang | H01L 23/5225 |
| | | | 257/508 |
| 7,958,629 B2 | 6/2011 | Thompson et al. | |
| 8,012,868 B1 * | 9/2011 | Naval | H01L 23/552 |
| | | | 257/784 |
| 8,030,722 B1 | 10/2011 | Bolognia et al. | |
| 8,058,715 B1 | 11/2011 | Roa et al. | |
| 8,071,431 B2 | 12/2011 | Hoang et al. | |
| 8,102,032 B1 | 1/2012 | Bolognia et al. | |
| 8,115,283 B1 | 2/2012 | Bolognia et al. | |
| 8,212,323 B2 | 7/2012 | Lee et al. | |
| 8,399,972 B2 | 3/2013 | Hoang et al. | |
| 9,041,168 B2 | 5/2015 | Hoang et al. | |
| 9,703,913 B2 | 7/2017 | Chen et al. | |
| 10,061,885 B2 | 8/2018 | Chen et al. | |
| 2001/0013165 A1 | 8/2001 | Hansen et al. | |
| 2001/0015705 A1 | 8/2001 | Scordilis | |
| 2001/0033210 A1 | 10/2001 | Tanabe | |
| 2002/0080593 A1 | 6/2002 | Tsuge et al. | |
| 2002/0083570 A1 | 7/2002 | Inoue et al. | |
| 2002/0155738 A1 | 10/2002 | Ohsawa et al. | |
| 2003/0002271 A1 | 1/2003 | Nurminen | |
| 2003/0020173 A1 * | 1/2003 | Huff | B81B 7/0064 |
| | | | 257/774 |
| 2003/0169134 A1 | 9/2003 | Ammar et al. | |
| 2004/0012099 A1 | 1/2004 | Nakayama | |
| 2004/0048588 A1 | 3/2004 | Ammar et al. | |
| 2004/0125568 A1 | 7/2004 | Tao | |
| 2004/0180474 A1 | 9/2004 | Oman | |
| 2004/0203528 A1 | 10/2004 | Ammar et al. | |
| 2004/0231872 A1 | 11/2004 | Arnold et al. | |
| 2004/0238934 A1 | 12/2004 | Warner | |
| 2005/0167047 A1 | 8/2005 | Huff et al. | |
| 2005/0245001 A1 * | 11/2005 | Hyvonen | H01L 23/5389 |
| | | | 438/107 |
| 2006/0033664 A1 | 2/2006 | Soler Castany et al. | |
| 2006/0139118 A1 | 6/2006 | Vaughn et al. | |
| 2006/0145361 A1 | 7/2006 | Yang | |
| 2006/0276158 A1 | 12/2006 | Okabe | |
| 2007/0071886 A1 | 3/2007 | Babb et al. | |
| 2008/0014678 A1 | 1/2008 | Howard et al. | |
| 2008/0067656 A1 | 3/2008 | Leung et al. | |
| 2008/0158849 A1 | 7/2008 | Gallahan et al. | |
| 2008/0246126 A1 | 10/2008 | Bowles et al. | |
| 2010/0078771 A1 | 4/2010 | Barth et al. | |
| 2010/0078776 A1 | 4/2010 | Barth et al. | |
| 2010/0078777 A1 | 4/2010 | Barth et al. | |
| 2010/0078779 A1 | 4/2010 | Barth et al. | |
| 2011/0084368 A1 | 4/2011 | Hoang et al. | |
| 2011/0089529 A1 | 4/2011 | Fowlkes et al. | |
| 2011/0133905 A1 | 6/2011 | Hussain et al. | |
| 2011/0193649 A1 * | 8/2011 | Popelka | H01P 1/387 |
| | | | 333/1.1 |
| 2012/0008288 A1 | 1/2012 | Tsukamoto et al. | |
| 2012/0119346 A1 | 5/2012 | Im et al. | |
| 2012/0126347 A1 | 5/2012 | Yang et al. | |
| 2012/0140432 A1 | 6/2012 | Andrei | |
| 2012/0146178 A1 | 6/2012 | Hoang et al. | |
| 2012/0258594 A1 | 10/2012 | Barth et al. | |

(56) References Cited

U.S. PATENT DOCUMENTS

| | | | | |
|---|---|---|---|---|
| 2013/0036802 A1* | 2/2013 | Johnson | ............... | G01N 27/223 |
| | | | | 73/74 |
| 2013/0041334 A1* | 2/2013 | Prioleau | ................. | A61F 13/42 |
| | | | | 604/361 |
| 2013/0135158 A1* | 5/2013 | Faraone | ................. | H01Q 13/10 |
| | | | | 343/702 |
| 2013/0324069 A1* | 12/2013 | Chen | ........................ | H04B 1/44 |
| | | | | 455/334 |

FOREIGN PATENT DOCUMENTS

| | | |
|---|---|---|
| CN | 102105981 | 6/2011 |
| CN | 102237342 | 11/2011 |
| CN | 102315199 | 1/2012 |
| JP | 04-058596 | 2/1992 |
| JP | 08222885 | 8/1996 |
| KR | 10-2012-0053332 | 5/2012 |
| WO | WO 1999/062119 | 12/1999 |
| WO | WO 2000/013233 | 3/2000 |
| WO | WO 2002/017394 | 2/2002 |
| WO | WO 2005/050699 | 6/2005 |
| WO | WO 2005/093833 | 10/2005 |
| WO | WO 2008/018959 | 2/2008 |
| WO | WO 2008/103232 | 8/2008 |
| WO | WO 2010/014103 | 2/2010 |

\* cited by examiner

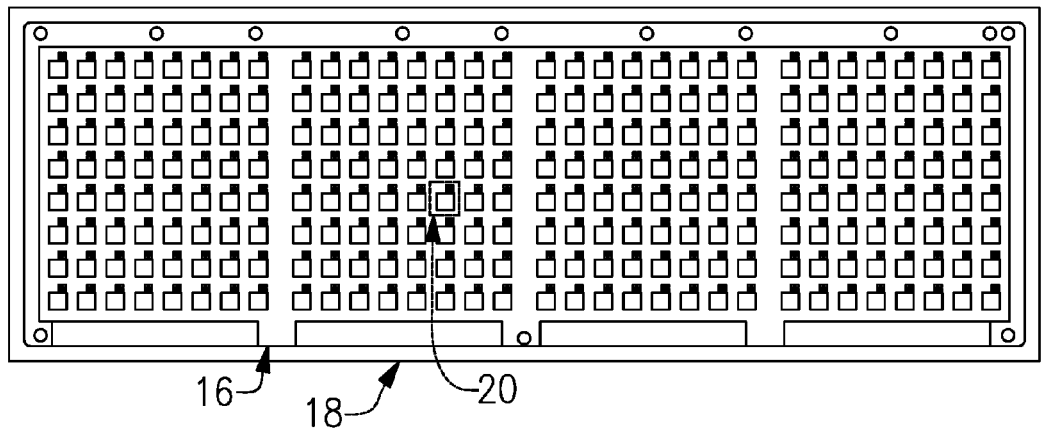
FIG.3A1
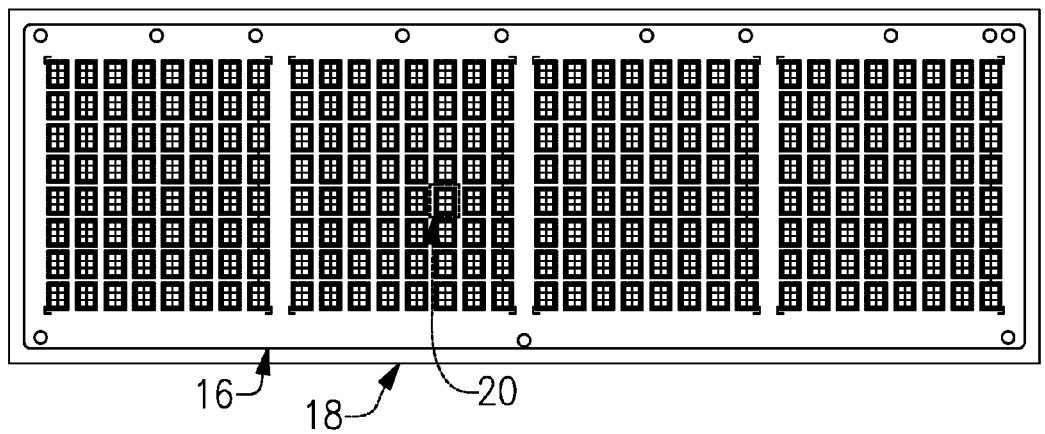
FIG.3A2

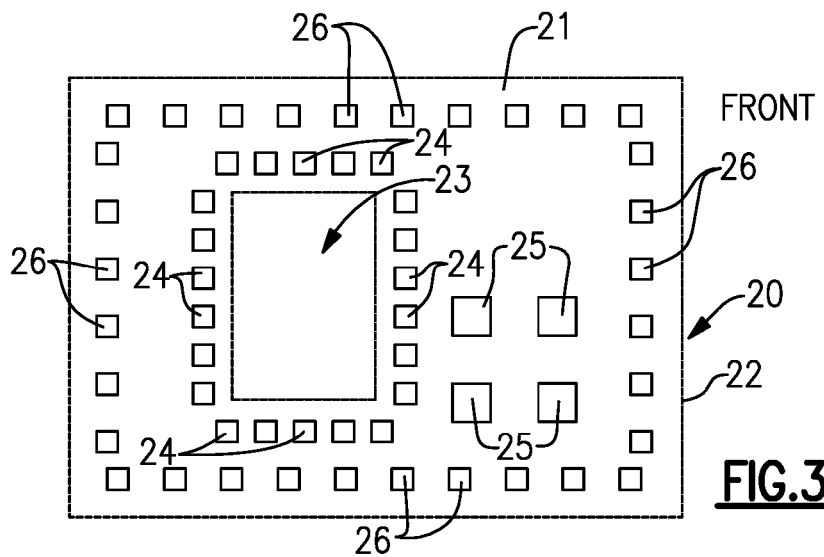
FIG.3B1
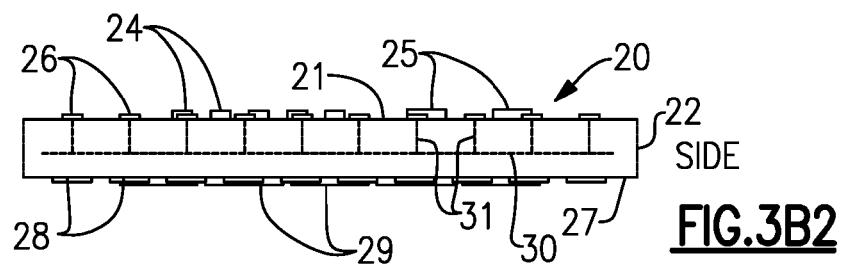
FIG.3B2
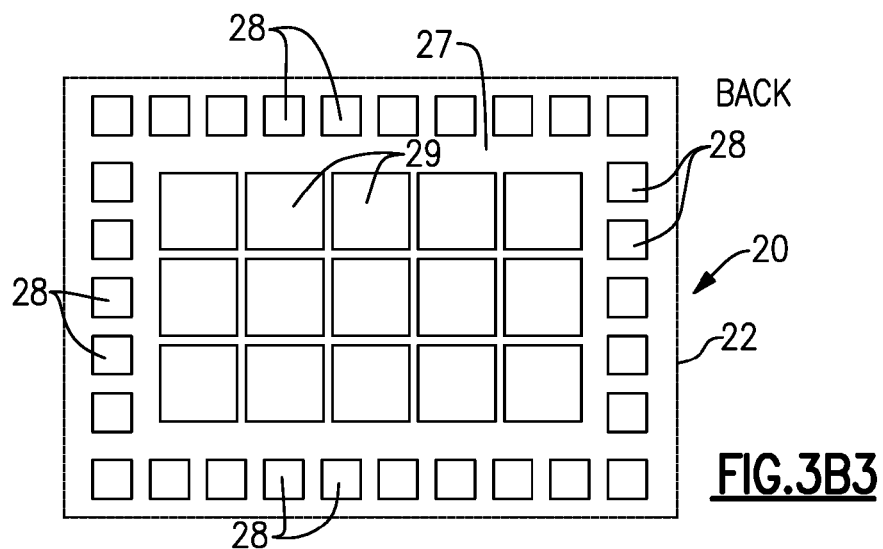
FIG.3B3

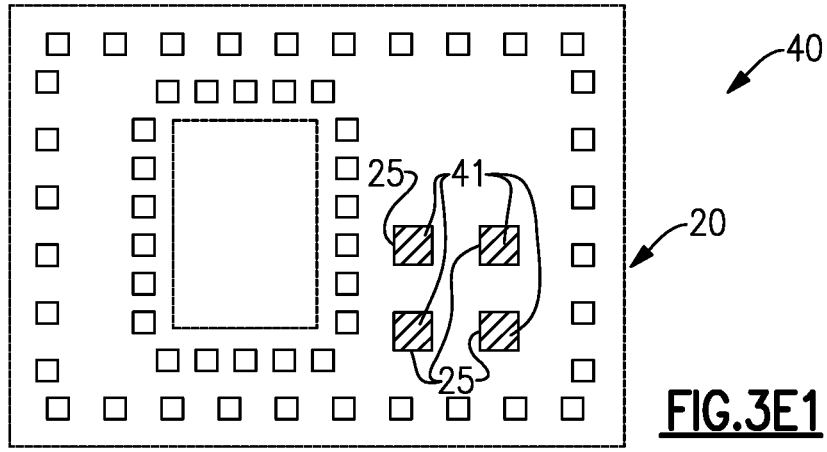
FIG.3E1
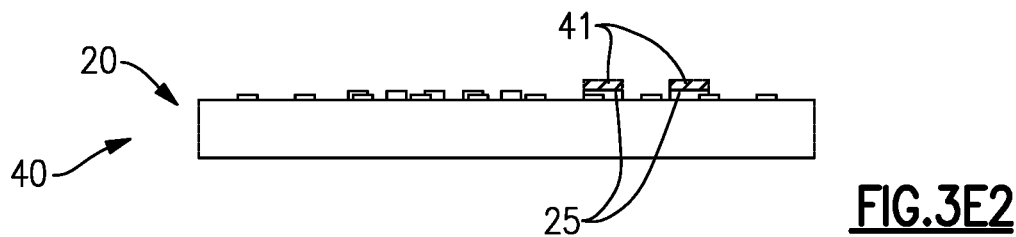
FIG.3E2
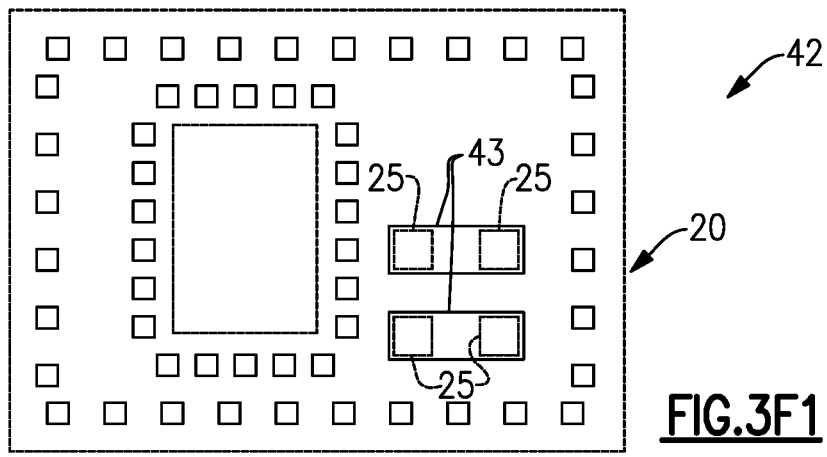
FIG.3F1
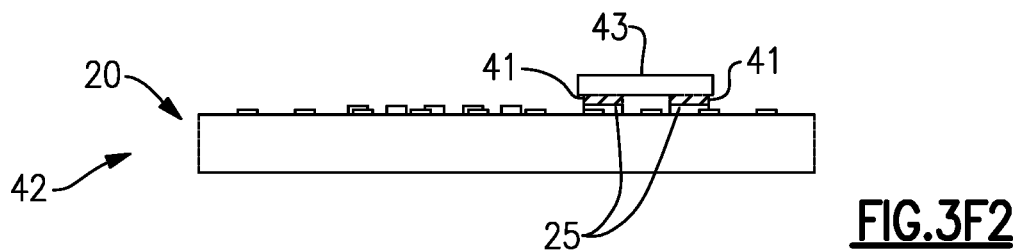
FIG.3F2

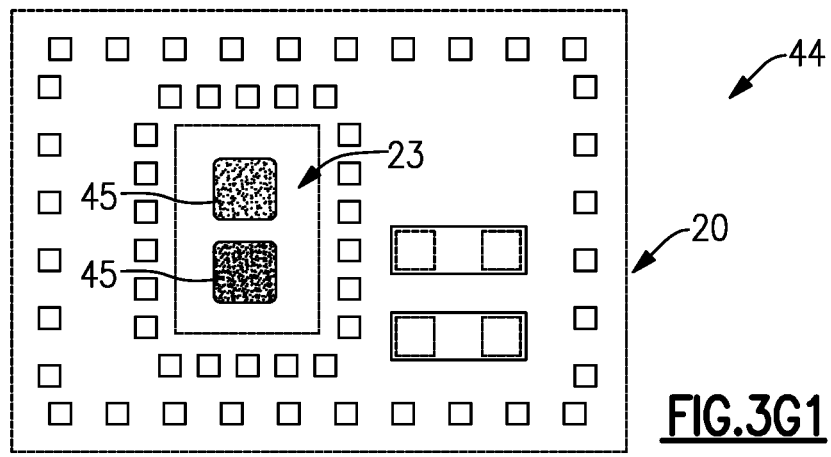
FIG.3G1
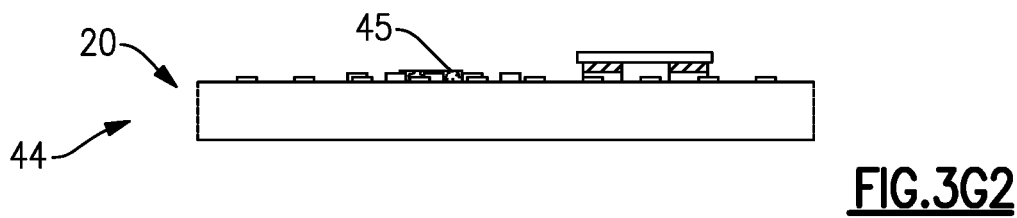
FIG.3G2
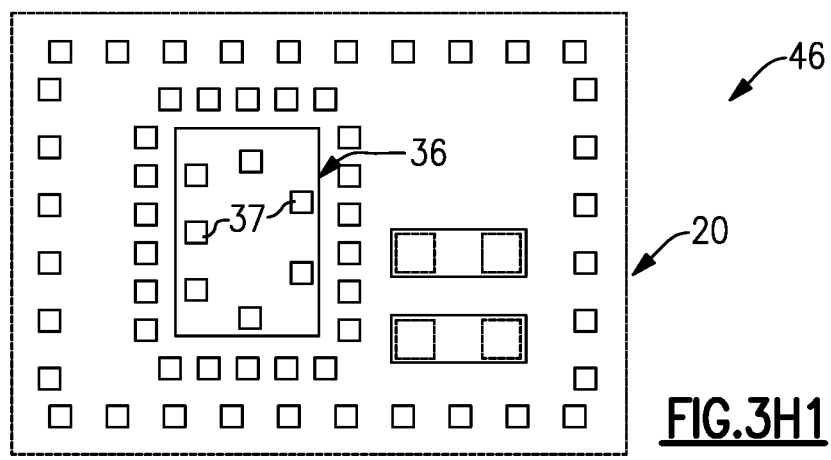
FIG.3H1
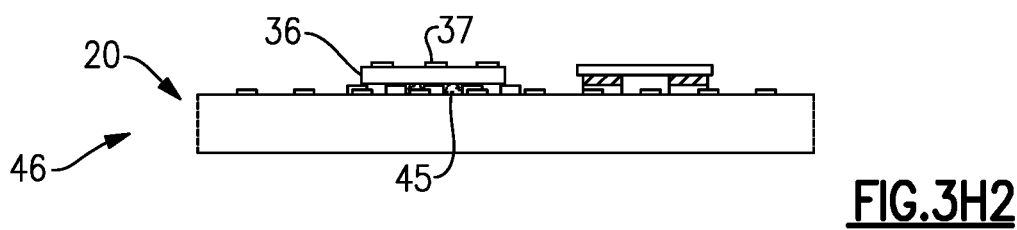
FIG.3H2

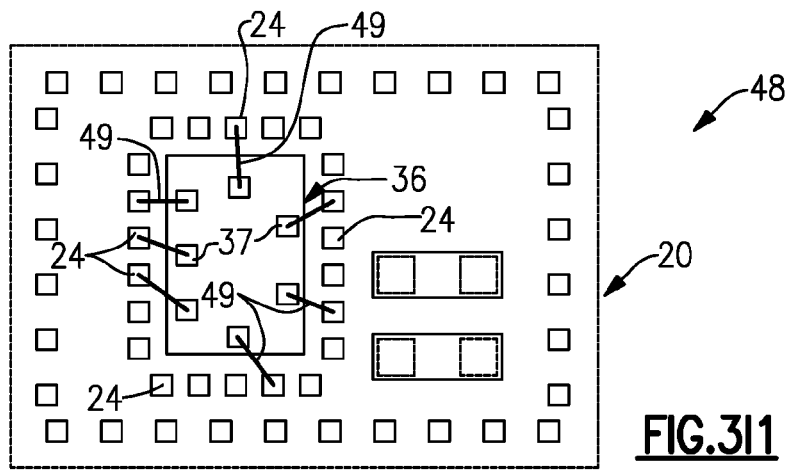
FIG.3I1
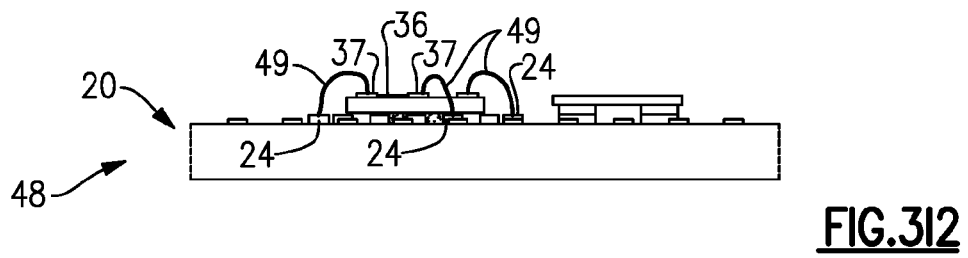
FIG.3I2
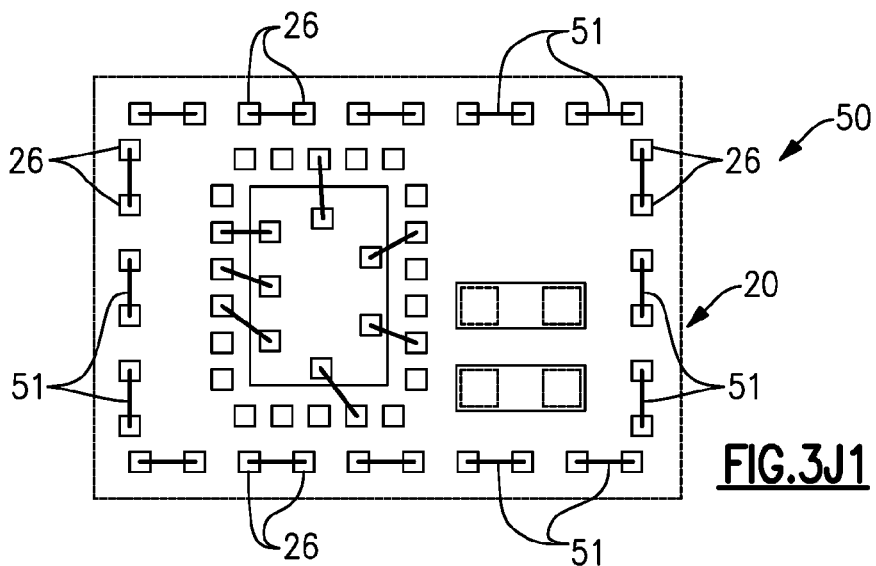
FIG.3J1
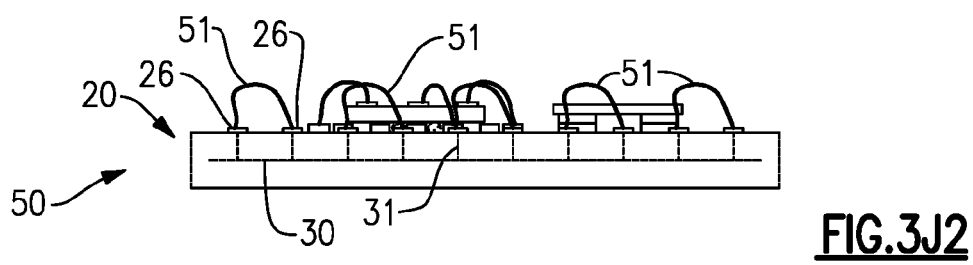
FIG.3J2

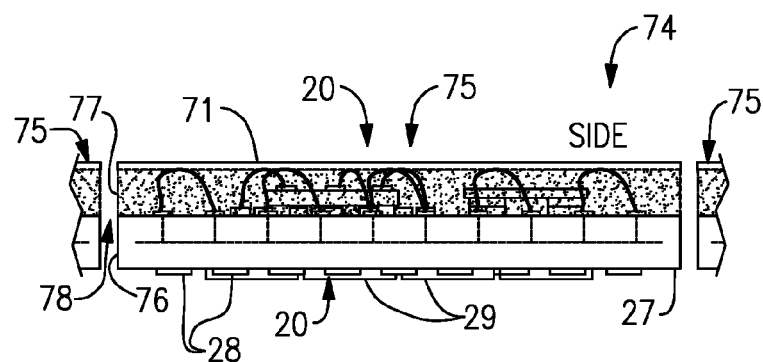
FIG.3R
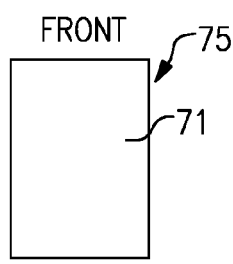
FIG.3S1
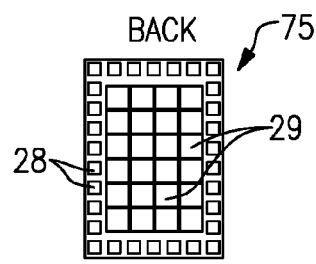
FIG.3S2
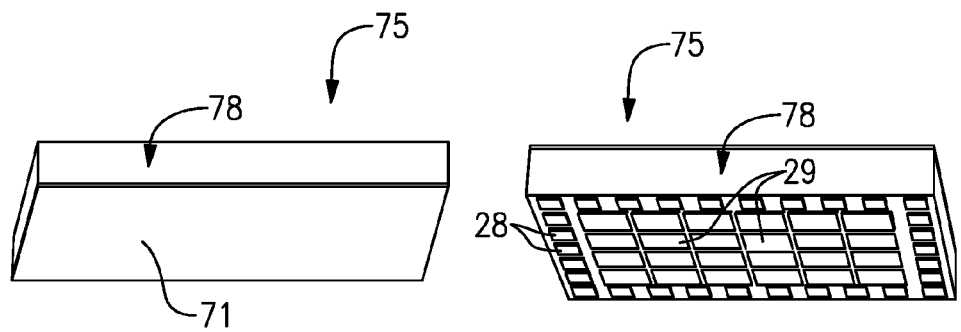
FIG.3S3

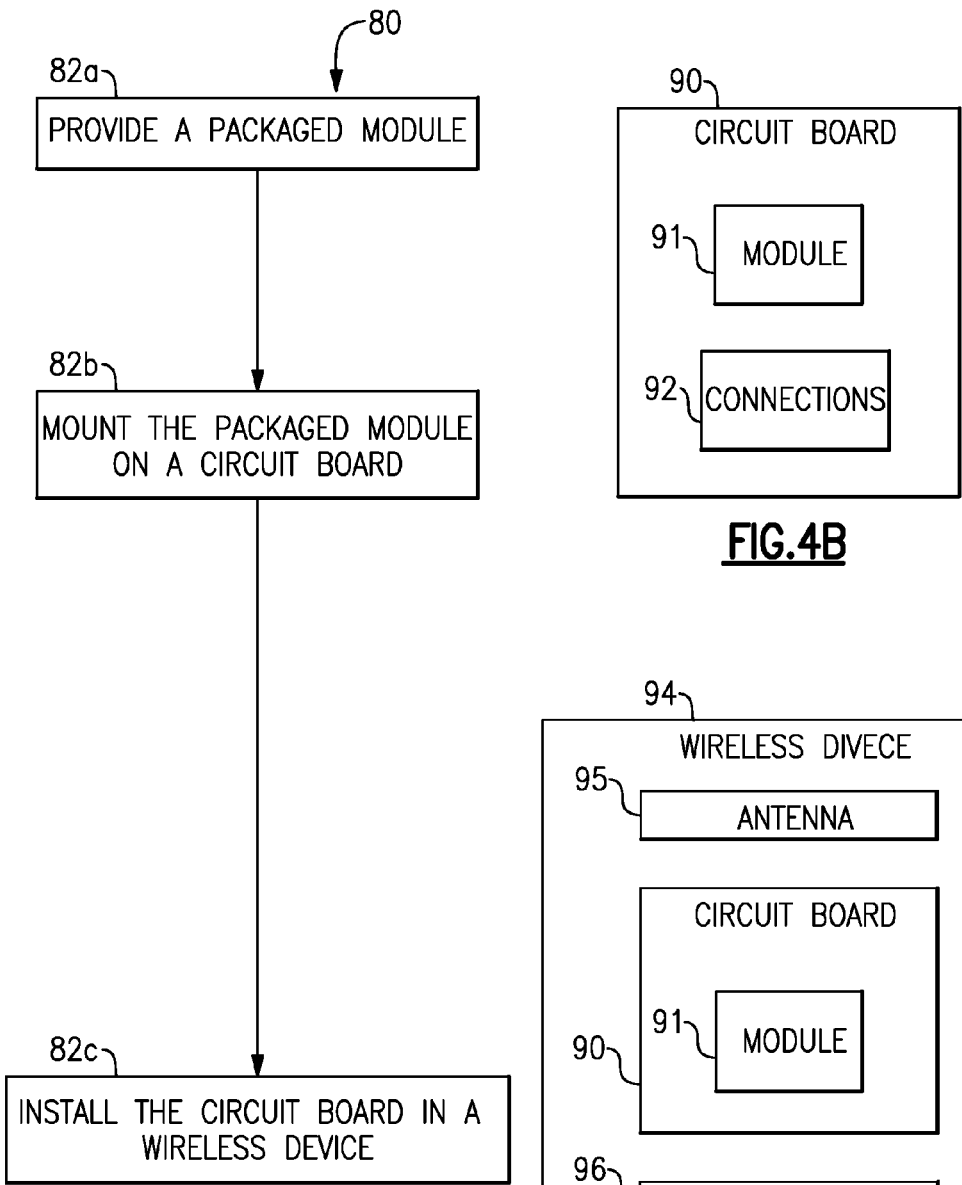

RADIO FREQUENCY ISOLATION STRUCTURE WITH RACETRACK

RELATED APPLICATIONS

This application is a divisional of U.S. patent application Ser. No. 13/939,066, filed Jul. 10, 2013, titled "RACETRACK DESIGN IN RADIO FREQUENCY SHIELDING APPLICATIONS," which claims the benefit of priority under 35 U.S.C. § 119(e) of U.S. Provisional Patent Application No. 61/671,594, filed Jul. 13, 2012, titled "RACETRACK DESIGN IN RADIO FREQUENCY SHIELDING APPLICATIONS", the disclosures of each which are herein incorporated by reference in their entireties.

BACKGROUND

Technical Field

The present disclosure relates to packaged semiconductor structures and, more particularly, to structures configured to provide radio frequency (RF) isolation.

Description of the Related Technology

Packaged semiconductor modules can include integrated shielding technology. To form a shield, which can be referred to as a "Faraday cage," a top conductive layer can be electrically connected to a racetrack by other conductive features. A racetrack can be a conductive feature in the substrate along a periphery of the substrate. The racetrack can be configured at a ground potential. The racetrack can be electrically connected to conductive features in a different layer of the substrate by a plurality of vias. One or more layers in the substrate can each include a racetrack.

For instance, the racetrack can be electrically connected to a ground plane and form a portion of an electrical connection between the top conductive layer and the ground plane. The racetrack can function as part of the shield itself. However, the racetrack consumes area in the packaged module. At the same time, the racetrack can affect a strength of the ground connection of the shield.

SUMMARY OF CERTAIN INCENTIVE ASPECTS

The innovations described in the claims each have several aspects, no single one of which is solely responsible for its desirable attributes. Without limiting the scope of this invention, some prominent features will now be briefly discussed.

One aspect of this disclosure is a packaged module that includes a substrate configured to receive at least one component, a radio frequency (RF) component coupled to a major surface of the substrate, and an RF isolation structure. The RF isolation structure includes a racetrack disposed below the major surface of the substrate, a conductive layer disposed above the RF component, and one or more conductive features disposed between the racetrack and the conductive layer. The one or more conductive features are configured to provide at least a portion of an electrical connection from racetrack to the conductive layer. The racetrack is configured at a ground potential and disposed around the RF component in the substrate. The racetrack has a break and/or a narrowed section.

The break or the narrowed section can be disposed in a low radiating area of the packaged module. In certain implementations, the low radiating area of the packaged module can be associated with a minimum radiation around the perimeter of the packaged module. According to some implementations, the low radiating area can have a low activity factor relative to other areas of the packaged module.

The racetrack can have at least one break and at least one narrowed section in certain implementations. In accordance with some implementations, the racetrack can include a plurality of narrowed sections. The racetrack can have a plurality of breaks according to a number of implementations.

The racetrack can be disposed along a periphery of the packaged module, in accordance with a number of implementations. In a various implementations, the one or more conductive features include wirebonds.

The RF isolation structure can also include an additional racetrack disposed below the major surface of the substrate and electrically connected to the racetrack by a plurality of the vias, according to certain implementations. The additional racetrack can have a break and/or a narrowed section.

According to various implementations, the RF component can include a power amplifier.

Another aspect of this disclosure is a packaged module that includes a substrate configured to receive at least one component, a radio frequency (RF) component coupled to a major surface of the substrate, and an RF isolation structure. The RF isolation structure includes a racetrack disposed below the major surface of the substrate and around the perimeter of the RF component. The racetrack is configured at a ground potential. The racetrack has a first width that is narrower in a section corresponding to a low radiating area of the packaged module than a second width in a section of the racetrack corresponding to a hot spot of the packaged module. The RF isolation structure also includes a conductive layer disposed above the RF component and conductive features disposed between the racetrack and the conductive layer. The conductive features are configured to provide at least a portion of an electrical connection from the racetrack to the conductive layer.

Another aspect of this disclosure is a wireless device that includes an antenna configured to facilitate transmitting and/or receiving a radio-frequency (RF) signal, a packaged module in communication with the antenna, and an other electronic module in communication with the packaged module. The packaged module includes a substrate configured to receive a plurality of components; a radio frequency (RF) component coupled to a major surface the substrate. The packaged module also includes a racetrack in the substrate disposed around the RF component below the major surface of the substrate. The racetrack is configured at a ground potential. The racetrack has a section with break or a width that is narrower than other portions of the racetrack. The packaged module also includes a conductive layer disposed above the RF component. The conductive layer is electrically connected to the racetrack such that the racetrack and the conductive layer form at least a portion of an RF isolation structure around the RF component.

In certain implementations, the section including the break or the narrow width can be disposed in a low radiating area of the packaged module. According to some of these implementations, the RF component can be configured to emit less electromagnetic radiation to the low radiating area of the packaged module than to other areas of the packaged module. Alternatively or additionally, the packaged module can be configured to receive less electromagnetic radiation at the low radiating area of the packaged module from the other electronic module than at other areas of the packaged module.

The racetrack can have one or more breaks and one or more narrowed sections.

According to some implementations, the packaged module can also include wirebonds configured to provide at least a portion of an electrical connection between the racetrack and the conductive layer, in which the RF isolation structure including the wirebonds.

Yet another aspect of this disclosure is a method of determining a racetrack layout. The method includes identifying low radiating areas of a module that includes a radio frequency (RF) component coupled to a major surface of a substrate, and determining a racetrack layout based on identifying the low radiating areas of the module. The racetrack is disposed below the major surface of the substrate and is included in an RF isolation structure around the RF component. The RF isolation structure also includes a conductive layer above the RF component.

According to certain implementations, determined racetrack layout can include a section with a reduced width in an identified low radiating area of the module relative to a width in other sections of the determined racetrack layout. Alternatively or additionally, the determined racetrack layout can include a break in an identified low radiating area of the module.

In some implementations, the RF isolation structure can also include wirebonds configured to provide at least a portion of an electrical connection between the racetrack and the conductive layer above the RF component.

In accordance with a number of implementations, the determined racetrack layout can be included in at least two separate layers in the substrate.

According to various implementations, the method can also include obtaining electromagnetic interference data for the module, and identifying the low radiating areas based on the obtained electromagnetic interference data. In some of these implementations, obtaining electromagnetic interference data can include obtaining electromagnetic interference data for at least two different modes of operation of the RF component.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 3A1 and 3A2 show front and back sides of an example laminate panel configured to receive a plurality of dies for formation of packaged modules.

FIGS. 3B1 to 3B3 show various views of a laminate substrate of the panel configured to yield an individual module.

FIGS. 3E1 and 3E2 show various views of the laminate substrate being prepared for mounting of example surface-mount technology (SMT) devices.

FIGS. 3F1 and 3F2 show various views of the example SMT devices mounted on the laminate substrate.

FIGS. 3G1 and 3G2 show various views of the laminate substrate being prepared for mounting of an example die.

FIGS. 3H1 and 3H2 show various views of the example die mounted on the laminate substrate.

FIGS. 3I1 and 3I2 show various views of the die electrically connected to the laminate substrate by example wirebonds.

FIGS. 3J1 and 3J2 show various views of wirebonds formed on the laminate substrate and configured to facilitate electromagnetic (EM) isolation between an area defined by the wirebonds and areas outside of the wirebonds.

FIG. 3R shows individual packaged modules being cut from the panel.

FIGS. 3S1 to 3S3 show various views of an individual packaged module.

FIG. 4A shows a process that can be implemented to install a packaged module having one or more features as described herein on a circuit board such as the phone board of FIG. 3T.

FIG. 4B schematically depicts the circuit board with the packaged module installed thereon.

FIG. 4C schematically depicts a wireless device having the circuit board with the packaged module installed thereon.

Figure 1A:
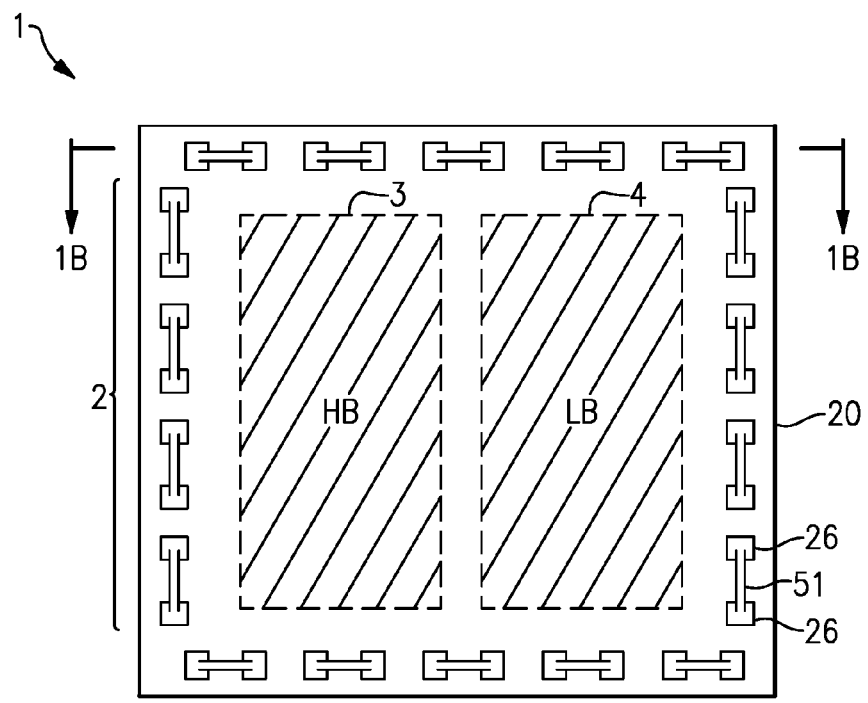
FIG. 1A is top plan view of an illustrative packaged module.

Features of the apparatus, systems, and methods will be described with reference to the drawings summarized above.

Throughout the drawings, reference numbers are re-used to indicate correspondence between referenced elements. It will be understood that all drawings are not necessarily to scale. The drawings, associated descriptions, and specific implementations are provided for illustrative purposes and are not intended to limit the scope of the disclosure.

DETAILED DESCRIPTION OF SOME EMBODIMENTS

An RF isolation structure around an RF component can isolate the RF component from external radiation and/or isolate an external component from radiation emitted by the RF component. The RF isolation structure can include a racetrack, conductive features, and a conductive layer disposed above an RF component. In some implementations, the racetrack can provide part of an electrical connection between a ground plane and the top conductive layer. Conductive features, such as wirebonds, can provide at least a portion of an electrical connection between the racetrack and the conductive layer disposed above the RF component. It can be desirable to have a strong ground connection to the RF isolation structure. The strength of the RF isolation structure can be based on a strength of the ground connection. A thicker racetrack can provide a stronger ground connection. In previous designs, a continuous racetrack having a uniform width was included along a periphery of a packaged module. Such racetracks consumed die area and increased costs of the packaged module.

In this disclosure, it is recognized that a racetrack layout can be determined based on electromagnetic interference (EMI) data, such as EMI probing data and/or near field scan data. Particular features related to isolation associated with RF signals are also recognized in this disclosure. One or more features described herein relate to selectively narrowing and/or removing portions of a racetrack such that an RF isolation structure provides desired RF isolation without consuming excess die area. For instance, EMI data from a particular environment can be obtained and a racetrack layout can be determined based on such data.

Generally described, aspects of this disclosure relate to determining a layout of a racetrack that that is part of an RF isolation structure. The racetrack layout can have a non-uniform width to match the relative strength of the RF isolation structure in selected areas with RF isolation needs of a module that includes at least one RF component.

From simulation and/or EMI data, locations of "hot spots" and/or "low radiating areas" of a packaged module can be determined. A "hot spot" can be an area of the packaged module that emits a relatively high amount of electromagnetic radiation and/or an area of the packaged module that receives a relatively high amount of external electromagnetic radiation. A "low radiating area" can be an area of the packaged module that emits a relatively low amount of electromagnetic radiation and/or an area of the packaged module that receives a relatively low amount of external electromagnetic radiation.

Based on the locations of the hot spots and/or low radiating areas, the racetrack can include a break in one or more selected areas of the packaged module without significantly degrading the EMI performance of the RF isolation structure. Alternatively or additionally, based on the locations of the hot spots and/or low radiating areas, a width of the racetrack that is part of the RF isolation structure can be narrowed in one or more selected areas of the packaged module without significantly degrading the EMI performance of the RF isolation structure. More specifically, the racetrack can include a break and/or a narrowed section in a low radiating area of the packaged module.

Alternatively or additionally, the sensitivity of locations of the packaged module to external radiation can be determined. Based on the sensitivity data, the racetrack can include a break and/or a section with a narrowed width in one or more selected areas.

By including a break in the racetrack and/or narrowing sections of the racetrack, the RF isolation structure can consume less area in one or more layers of a substrate. As a result, the packaged module can be smaller, less expensive, consume less power, or any combination thereof. Tailoring racetrack layout to particular RF isolation needs can reduce the total amount of metal used to manufacture the packaged module without significantly degrading EMI performance. This can reduce the total cost of a packaged module that includes the racetrack. In production, these cost savings can be significant when a large number of packaged modules are manufactured.

Described herein are various examples of systems, apparatus, devices structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality. It will also be understood that one or more features described herein can be applied to isolation structures that do not include wirebonds.

For the purpose of description, it will be understood that RF-isolation can include keeping RF signals or noise from entering or leaving a given shielded area. Thus, for the purpose of description, it will be understood that the terms isolation and shielding can be used interchangeably as appropriate. For example, an RF component being shielded can include a situation where some or substantially all of an RF signal from another source is being blocked from reaching the RF component. As another example, an RF component being isolated can include a situation where some or substantially all of an RF signal (for example, noise or an actively generated signal) is being blocked from reaching from another device. Unless the context indicates otherwise, it will be understood that each of the terms shielding and isolation can include either or both of the foregoing functionalities.

FIG. 1A is top plan view of an illustrative packaged module 1. The packaged module 1 can include one or more circuit elements. In a number of embodiments, the one or more circuit elements include an RF circuit element. The packaged module 1 can include an RF isolation structure that includes one or more racetracks. The packaged module 1 can be a packaged integrated circuit. The illustrated packaged module 1 includes a radio frequency (RF) isolation structure 2 and an RF component that includes a high band portion 3 and a low band portion 4. Although not illustrated in FIG. 1A for clarity, the packaged module 1 can include numerous other structures.

The RF isolation structure 2 can function as a Faraday cage. The RF isolation structure 2 can include conductive features around at least one RF component. In certain implementations, the conductive features above the substrate can include a plurality of wirebonds 51 that in combination with a racetrack are configured to provide RF isolation. More details of the plurality of wirebonds 51 will be provided later, for example, with reference to FIGS. 3J1 and 3J2. In some other implementations, the conductive features can include other structures, such as a solid metal can.

The illustrated packaged module 1 is a packaged power amplifier integrated circuit (IC) in which the high band portion 3 includes a high band power amplifier circuit and the low band portion 4 includes a low band power amplifier circuit. Power amplifiers can be used to boost the amplitude of a relatively weak RF signal. Thereafter, the boosted RF signal can be used for a variety of purposes, including, for example, driving an antenna, a switch, a mixer, a filter, or the like, or any combination thereof in an RF system. In certain electronic systems, such as multi-band systems, different power amplifier structures can be used to amplify RF signals of different frequencies. In the illustrated configuration, the packaged module 1 includes the high band power amplifier circuit for amplifying relatively high frequency RF signals and the low band power amplifier circuit for amplifying relatively low frequency RF signals.

Although the packaged module 1 illustrates one example of a packaged IC that can be used herein, the methods and apparatus described herein can be implemented in connection with a variety of other isolation structures in packaged modules.

Figure 1B:
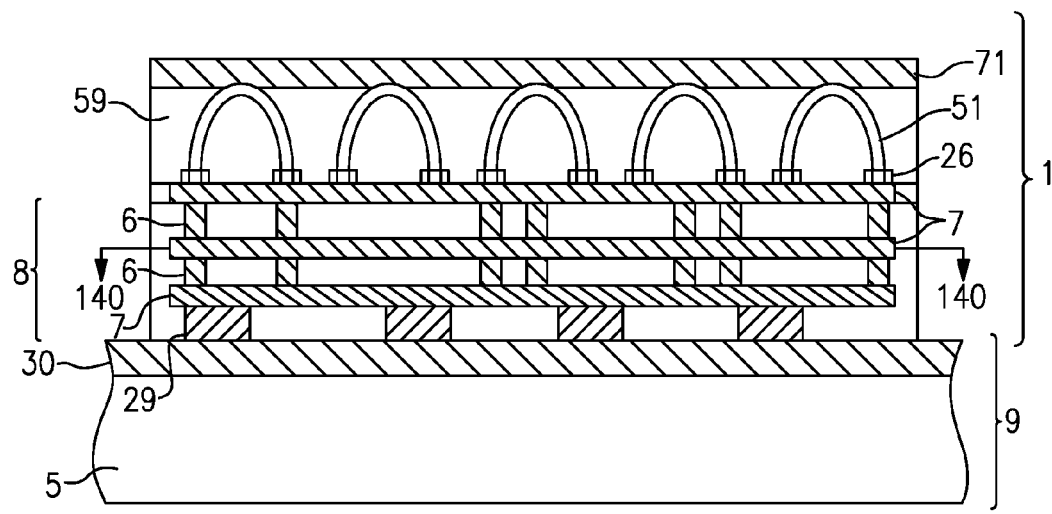
FIG. 1B shows a cross section of the packaged module of FIG. 1A along the line 1B-1B of FIG. 1A

FIG. 1B shows a cross section of the packaged module 1 along the line 1B-1B of FIG. 1A and a system circuit board 9 under the packaged module 1. The illustrated cross section shows a side view of the RF isolation structure 2. As illustrated, the packaged module 1 includes a printed circuit board 8, wirebonds 51, overmold structure 59, and a conductive layer 71 formed over the overmold structure 59. The system board 9 can include a substrate system board substrate 5 and an electrical reference plane 30, which can be a ground plane. The printed circuit board 8 can be a substrate, such as a laminate substrate. The printed circuit board 8 can include input output (I/O) pads (for example, ground contact pads 29), a plurality of vias 6, and one or more racetracks 7. The plurality of vias 6 and the one or more racetracks 7 can electrically connect the ground contact pads 29 to wirebond pads 26, thereby electrically connecting the reference plane 30 to the wirebonds 51. The printed circuit board 8 can also include a ground plane. The wirebonds 51 can be disposed above the printed circuit board 8 in the orientation shown in FIG. 1B. Overmold structure 59 can encapsulate the wirebonds 51. More detail about the overmold structure 59 will be provided later, for example, with reference to FIGS. 3L-3M. The wirebonds 51 can be electrically connected to the conductive layer 71.

As illustrated, the RF isolation structure 2 of the packaged module 1 includes the ground contact pads 29, the racetracks 7, the plurality of vias 6, the wirebonds 51, and the conductive layer 71. For instance, the racetracks 7 can provide RF isolation from RF signals generated by RF circuits within the RF isolation structure 2 and/or outside of the RF isolation structure 2. In the implementation shown in FIG. 1B, the racetrack 7 in combination with a plurality of vias 6 can block most of the power of an RF signal along sidewalls of the substrate of the packaged module 1. The layout of the racetrack 7 can be determined in accordance with one or more features described herein.

Although the illustrative cross section of FIG. 1B shows racetracks 7 in three layers, it will be understood that one or more features described herein can be applied to RF isolation structures that include a racetrack 7 in any suitable number of layers of the substrate. For instance, in other implementations, there can a single racetrack 7. As another example, in certain implementations there can be a racetrack 7 in each of four or more layers. In implementations with a racetrack 7 in two or more layers of metal routing in the substrate, the racetracks 7 can be have the same layout and/or different layouts in different layers.

Figure 2:
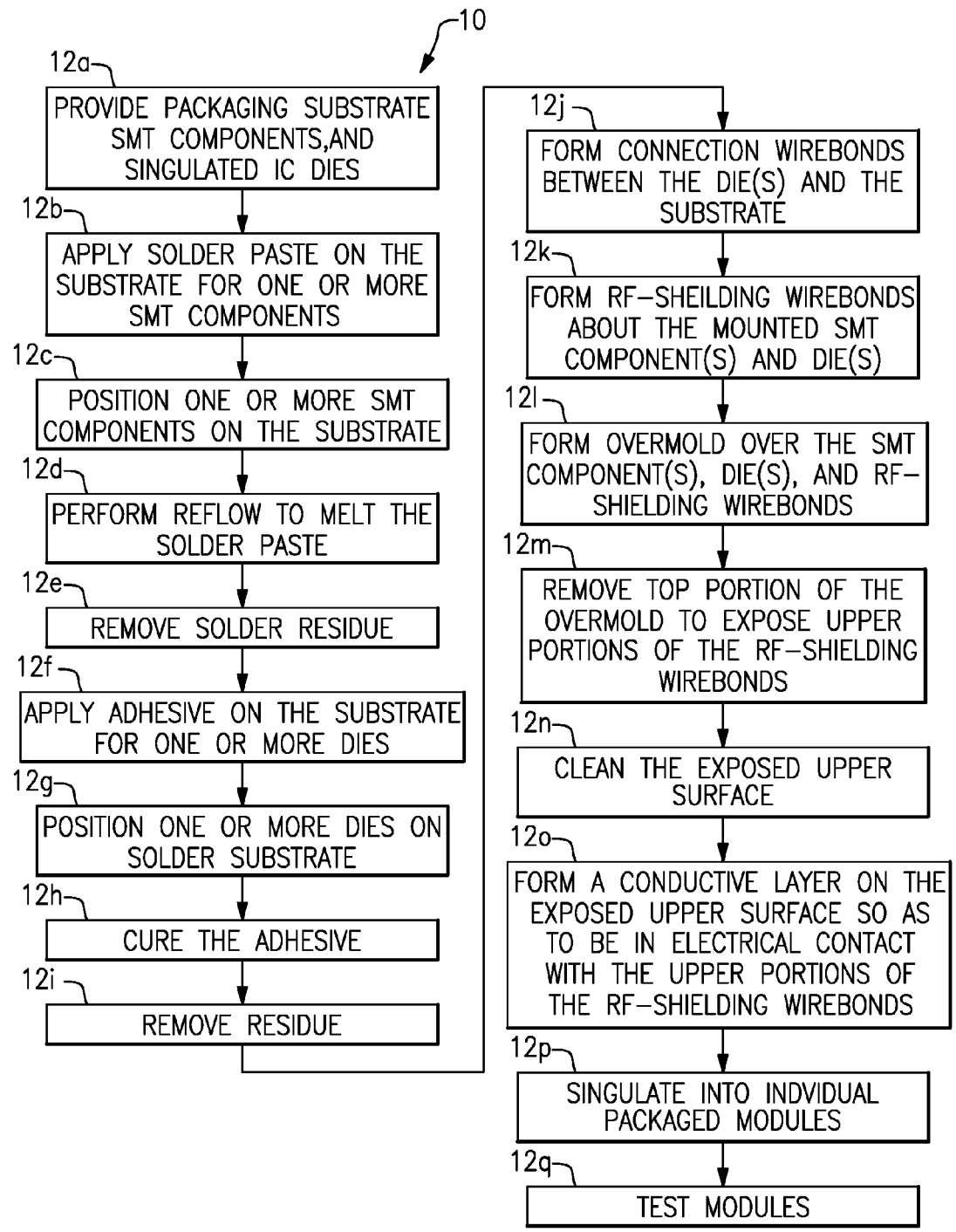
FIG. 2 shows a process that can be implemented to fabricate a packaged module that includes a die having an integrated circuit (IC).

FIG. 2 shows a process 10 that can be implemented to fabricate a packaged module 1, such as a packaged module, having and/or by way of one or more features as described herein. FIG. 2 shows various parts and/or stages of various operations associated with the process 10 of FIG. 2.

In block 12a of FIG. 2, a packaging substrate and parts to be mounted on the packaging substrate can be provided. Such parts can include, for example, one or more surface-mount technology (SMT) components and one or more singulated dies having integrated circuits (ICs). FIGS. 3A1 and 3A2 show that in some embodiments, the packaging substrate can include a laminate panel 16. FIG. 3A1 shows the front side of the example laminate panel 16; and FIG. 3A2 shows the back side of the example laminate panel 16. The laminate panel 16 can include a plurality of individual module substrates 20 arranged in groups that are sometimes referred to as arrays 18. Although four separate molded sections are shown in FIGS. 3A1, 3A2, 3M, and 3Q, any of the features described in the application can be applied to other suitable arrangements such as a single array mold cap without breaks.

FIGS. 3B1-3B3 show front, side and back views, respectively, of an example configuration of the individual module substrate 20. For illustrative purposes, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 are arranged about the die-receiving area 23 so as to allow formation of connection wirebonds between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads can be electrically connected to some of the module's contact pads and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. For instance, as shown in FIG. 1B, a plurality of vias 6 and/or one or more racetracks 7 can form at least part of the electrical connection between the wirebond pads 26 and the ground plane 30. The vias 6 and/or racetrack(s) 7 can form a portion of an RF isolation structure 2 around an RF circuit in the module. In some embodiments, the ground plane 30 may or may not be connected to the ground contact pads 29 disposed on the back surface 27. In some other embodiments (not shown), a ground plane can alternatively or additionally be included in the substrate of the module.

Figure 3C:
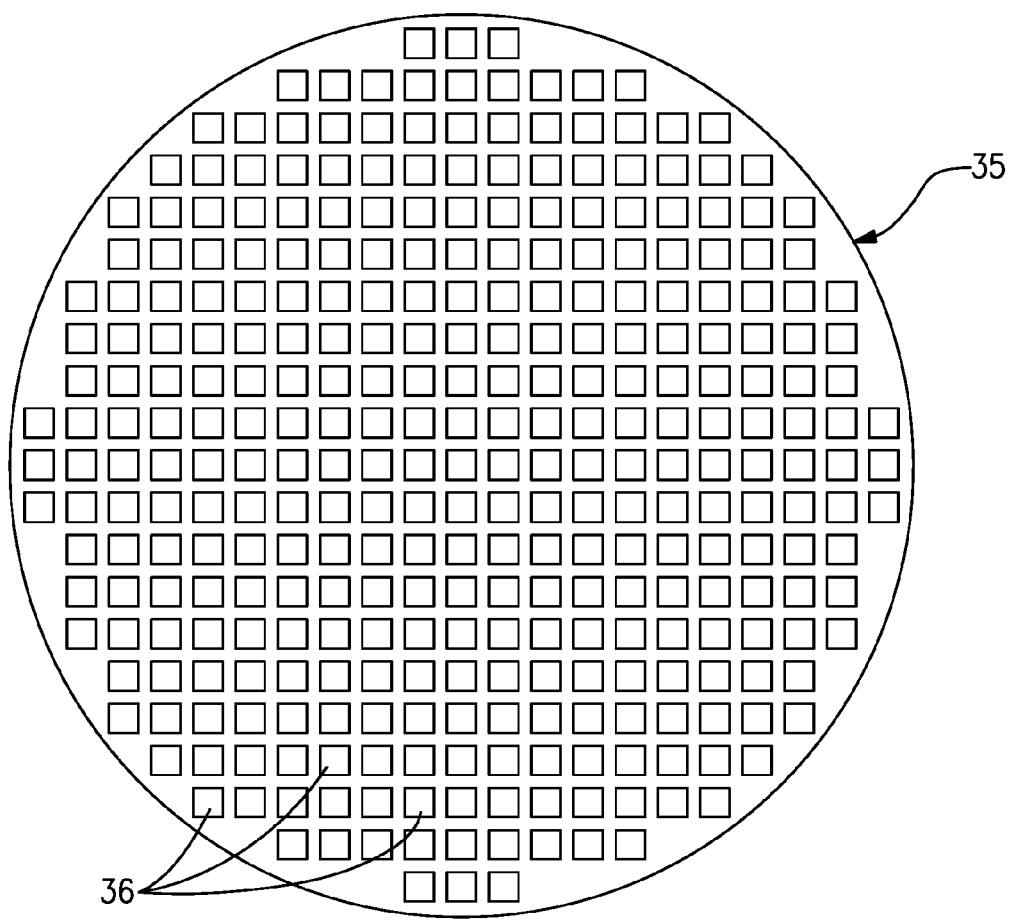
FIG. 3C shows an example of a fabricated semiconductor wafer having a plurality of dies that can be singulated for mounting on the laminate substrate.
Figure 3D:
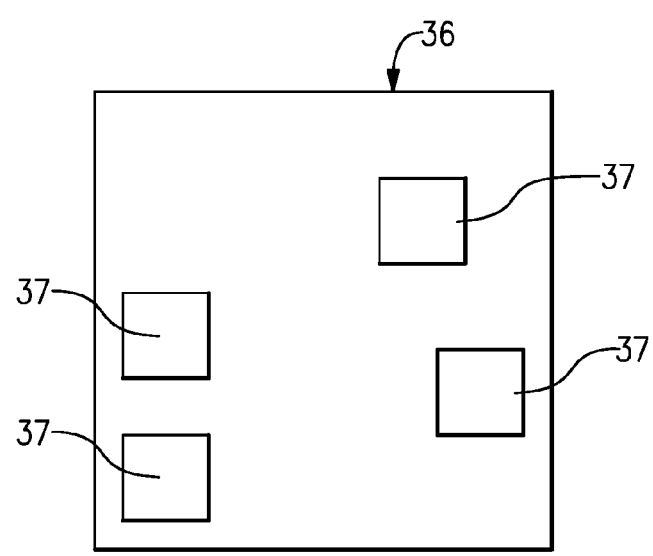
FIG. 3D depicts an individual die showing example electrical contact pads for facilitating connectivity when mounted on the laminate substrate.

FIG. 3C shows an example fabricated wafer 35 that includes a plurality of functional dies 36 awaiting to be cut (or sometimes referred to as singulated) into individual dies. Such cutting of the dies 36 can be achieved in a number of ways. FIG. 3D schematically depicts an individual die 36 where a plurality of metalized contact pads 37 can be provided. Such contact pads can be configured to allow formation of connection wirebonds between the die 36 and the contact pads 24 of the module substrate (e.g., FIG. 3B1).

In block 12*b* of FIG. 2, solder paste can be applied on the module substrate to allow mounting of one or more SMT devices. FIGS. 3E1 and 3E2 show an example configuration 40 where solder paste 41 is provided on each of the contact pads 25 on the front surface of the module substrate 20. In some implementations, the solder paste 41 can be applied to desired locations on the panel (e.g., 16 in FIG. 3A1) in desired amount by an SMT stencil printer.

In block 12*c* of FIG. 2, one or more SMT devices can be positioned on the solder contacts having solder paste. FIGS. 3F1 and 3F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12*d* of FIG. 2, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12*e* of FIG. 2, solder residue from the reflow operation of block 12*d* can be removed.

In block 12*f* of FIG. 2, adhesive can be applied on one or more selected areas on the module substrate 20 to allow mounting of one or more dies. FIGS. 3G1 and 3G2 show an example configuration 44 where adhesive 45 is applied in the die-mounting area 23. In some implementations, the adhesive 45 can be applied to desired locations on the panel (e.g., 16 in FIG. 3A1) in desired amount by techniques such as screen printing.

In block 12*g* of FIG. 2, one or more dies can be positioned on the selected areas with adhesive applied thereon. FIGS. 3H1 and 3H2 show an example configuration 46 where an example die 36 is positioned on the die-mounting area 23 by way of the adhesive 45. In some implementations, the die 36 can be positioned on the die-mounting area on the panel by an automated machine that is fed with dies from a tape reel.

In block 12*h* of FIG. 2, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12*i* of FIG. 2, adhesive residue from the mounting operation of blocks 12*f*-12*g* can be removed.

In block 12*j* of FIG. 2, electrical connections such as wirebonds can be formed between the mounted die(s) and corresponding contact pads on the module substrate 20. FIGS. 3I1 and 3I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12*k* of FIG. 2, a plurality of RF-shielding wirebonds can be formed about a selected area on the module substrate 20. FIGS. 3J1 and 3J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. The electrical connections between the RF-shielding wirebonds 51 and the ground plane 30 can include vias 6 and/or one or more racetracks 7, for example, as described with reference to FIG. 1B. As described herein, a conductive layer can be formed above such an area and connected to upper portions of the RF-shielding wirebonds 51 to thereby form an RF isolation structure 2 having an RF-shielded volume.

In the example configuration 50 of FIGS. 3J1 and 3J2, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired.

In the example configuration 50 of FIGS. 3J1 and 3J2, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVER-MOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 3J1 and 3J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 3K:
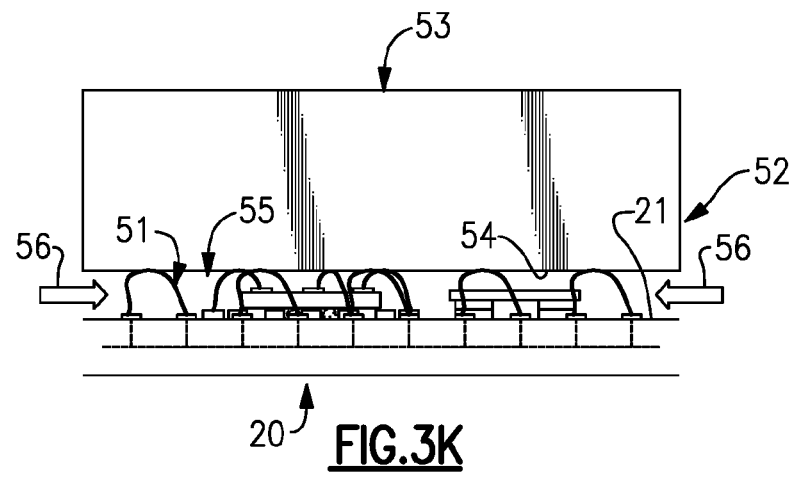
FIG. 3K shows a side view of molding configuration for introducing molding compound to a region above the laminate substrate.

In block 12*l* of FIG. 2, an overmold can be formed over the SMT component(s), die(s), and RF-shielding wirebonds. FIG. 3K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 3K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 3L:
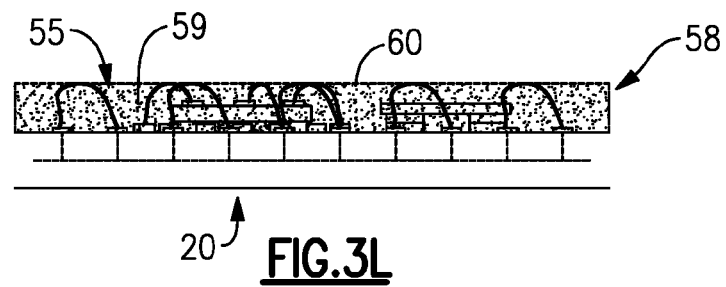
FIG. 3L shows a side view of an overmold formed via the molding configuration of FIG. 3K.

FIG. 3L shows an example configuration 58 where molding compound has been introduced into the volume 55 as described in reference to FIG. 3K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 3M:
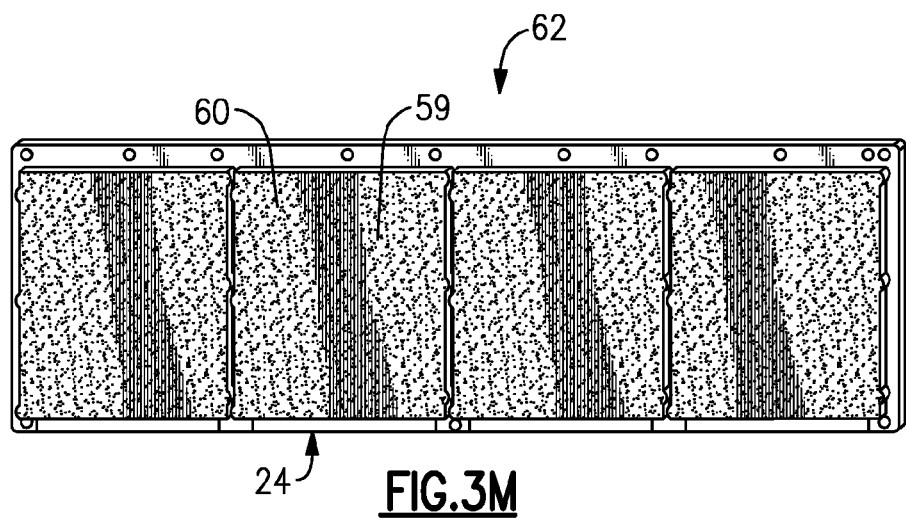
FIG. 3M shows the front side of a panel with the overmold.

FIG. 3M shows an example panel 62 that has overmold structures 59 formed over the multiple array sections. Each array section's overmold structure can be formed as described herein in reference to FIGS. 3K and 3L. The resulting overmold structure 59 is shown to define a common upper surface 60 that covers the multiple modules of a given array section.

The molding process described herein in reference to FIGS. 3K-3M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 3N:
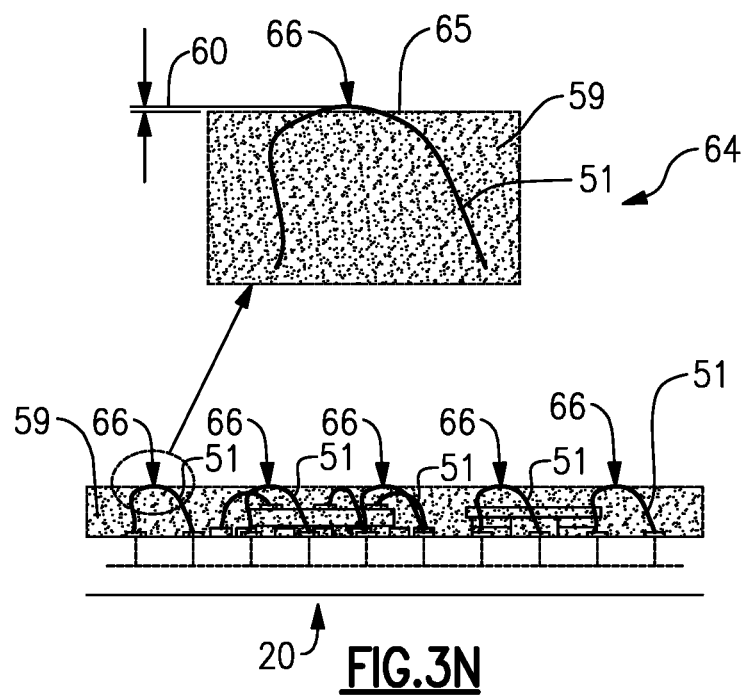
FIG. 3N shows a side view of how an upper portion of the overmold can be removed to expose upper portions of the EM isolation wirebonds.

In block 12m of FIG. 2, a top portion of the overmold structure can be removed to better expose upper portions of the RF-shielding wirebonds. FIG. 3N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 3O:
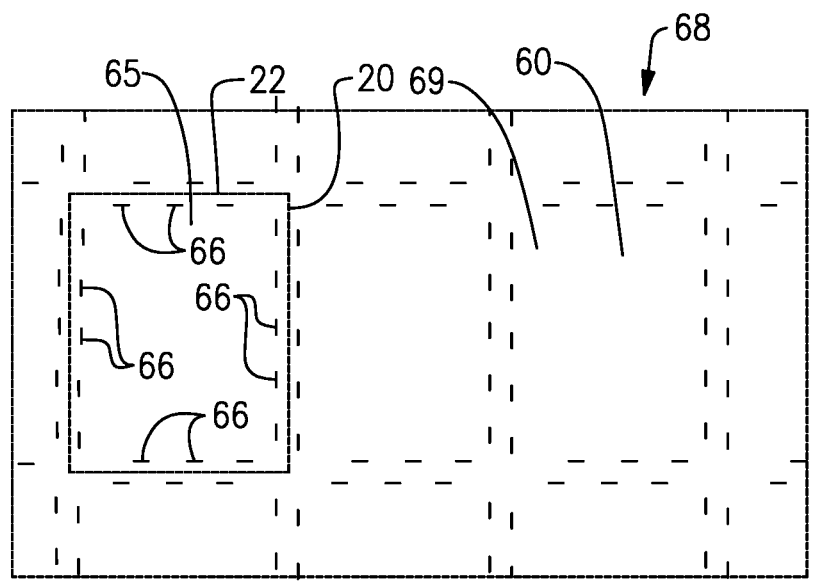
FIG. 3O shows a photograph of a portion of a panel where a portion of the overmold has its upper portion removed to better expose the upper portions of the EM isolation wirebonds.

The foregoing removal of material from the upper portion of the overmold structure 59 can be achieved in a number of ways. FIG. 3O shows an example configuration 68 where such removal of material is achieved by sand-blasting. In the example, the lighter-shaded portion is where material has been removed to yield the new upper surface 65 and better exposed upper portions 66 of the RF-shielding wirebonds. The darker-shaded portion is where material has not been removed, so that the original upper surface 60 still remains. The region indicated as 69 is where the material-removal is being performed.

In the example shown in FIG. 3O, a modular structure corresponding to the underlying module substrate 20 (depicted with a dotted box 22) is readily shown. Such modules will be separated after a conductive layer is formed over the newly formed upper surface 65.

In block 12n of FIG. 2, the new exposed upper surface resulting from the removal of material can be cleaned.

In block 12o of FIG. 2, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 3P:
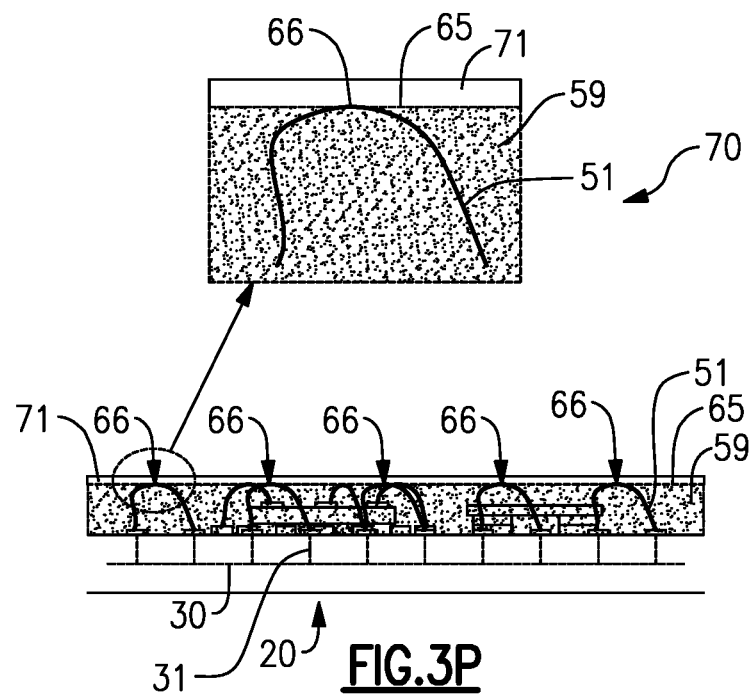
FIG. 3P shows a side view of a conductive layer formed over the overmold such that the conductive layer is in electrical contact with the exposed upper portions of the EM isolation wirebonds.

FIG. 3P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 3J, the RF-shielding wirebonds 51 and the ground plane 30 can yield an interconnected RF isolation structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 3Q:
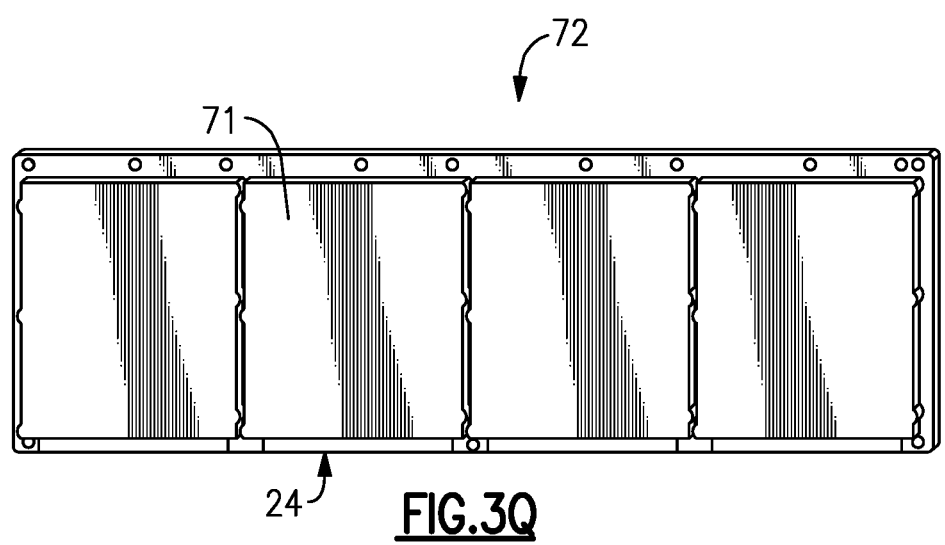
FIG. 3Q shows a photograph of a panel where the conductive layer can be a spray-on metallic paint.

FIG. 3Q shows an example panel 72 that has been sprayed with conductive paint to yield an electrically conductive layer 71 that covers multiple array sections. As described in reference to FIG. 3M, each array section includes multiple modules that will be separated.

In block 12p of FIG. 2, the modules in an array section having a common conductive layer (e.g., a conductive paint layer) can be singulated into individual packaged modules. Such singulation of modules can be achieved in a number of ways, including a sawing technique.

FIG. 3R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 3B, the lower surface 27 of the separated module 75 includes contact pads 28, 29 to facilitate electrical connections between the module 75 and a circuit board such as a phone board.

FIGS. 3S1, 3S2 and 3S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 2, the singulated modules can be tested for proper functionality. As discussed above, the modular form allows such testing to be performed easier. Further, the module's internal RF-shielding functionality allows such testing to be performed without external RF-shielding devices.

Figure 3T:
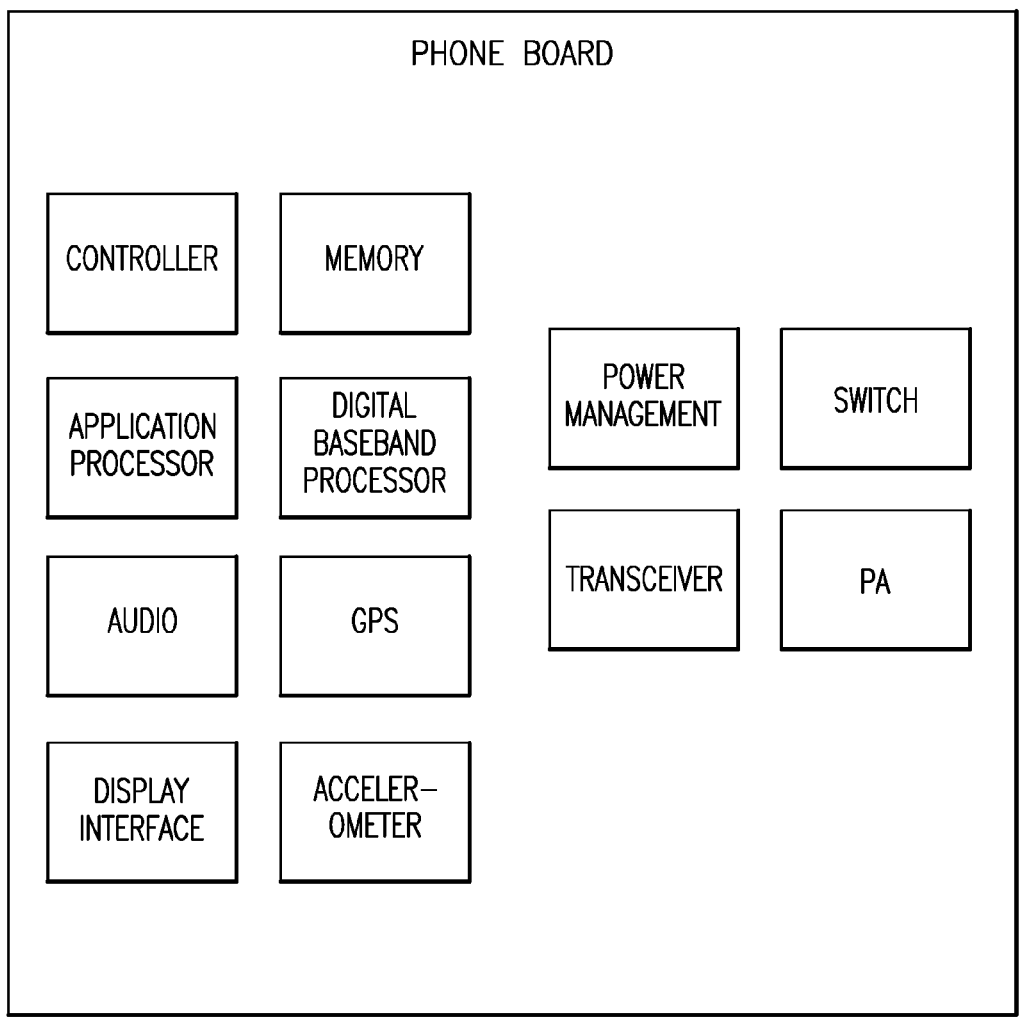
FIG. 3T shows that one or more of modules that are mounted on a wireless phone board can include one or more features as described herein.

FIG. 3T shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier (PA) module.

FIG. 4A shows a process 80 that can be implemented to assemble a packaged module having one or more features as described herein on a circuit board. In block 82*a*, a packaged module can be provided. In some embodiments, the packaged module can represent a module described in reference to FIG. 3T. In block 82*b*, the packaged module can be mounted on a circuit board (e.g., a phone board). FIG. 4B schematically depicts a resulting circuit board 90 having module 1 mounted thereon. While one module is illustrated as being mounted on the circuit board 90, it will be understood that one or more other modules can be also be mounted thereon. The circuit board 90 can also include other features such as a plurality of connections 92 to facilitate operations of various modules mounted thereon.

In block 82*c*, a circuit board having modules mounted thereon can be installed in a wireless device. FIG. 4C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

Figure 4D:
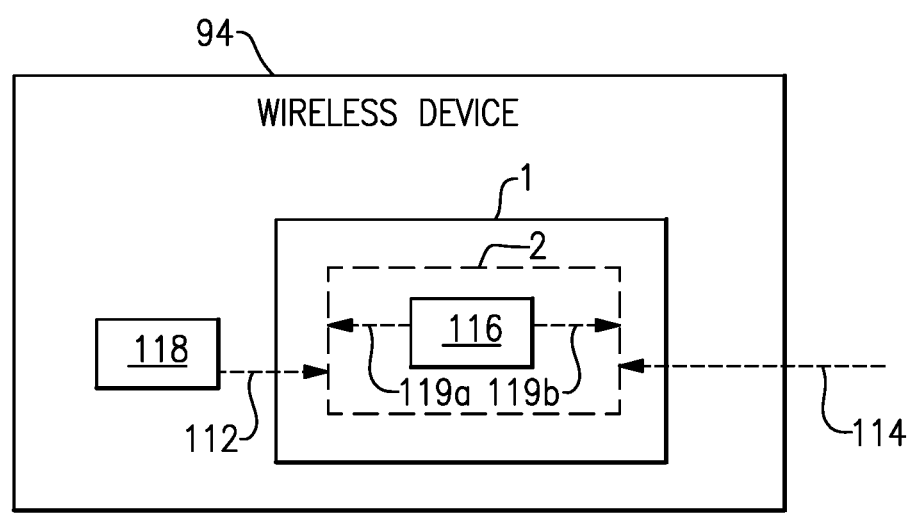
FIG. 4D schematically depicts an electronic device having a radio frequency (RF) isolation structure.

FIG. 4D schematically depicts a wireless device 94 having a packaged module 1, such as a chip or a module. The wireless device 94 can be a mobile device, such as a smart phone. The wireless device 94 illustrated in FIG. 4D can include one or more features shown in FIG. 4C, some of which have been omitted from FIG. 4D for illustrative purposes. In some embodiments, the packaged module 1 can include any of the modules described herein. As illustrated, the packaged module 1 includes an RF component 116 and an RF isolation structure 2 formed about the RF component 116 so as to provide RF isolation properties. The RF isolation structure 2 can be disposed about the perimeter of the packaged module 1 or disposed around the RF component 116 on other suitable areas of the packaged module 1. The RF isolation structure 2 can provide one or more RF isolation functionalities such as isolating the RF component 116 from an RF influence (arrow 112) from another device 118 on the electronic device 110, isolating the RF component 116 from an external RF source (arrow 114) outside of the electronic device 110, and/or preventing electromagnetic radiation (arrows 119*a* and 119*b*) from RF signals and/or noise from the RF component 116 from reaching the other device 118 on the electronic device 110 and/or to an external RF source (not shown) outside of the electronic device 110. The RF component 116 can include one or more circuit elements configured to transmit and/or receive an RF signal. Non-limiting examples of the RF component 116 include a power amplifier, a voltage-controlled oscillator, a filter, a switch, and the like. For instance, in the embodiment illustrated in FIG. 1A, the RF component can include the high band portion 3 and/or the low band portion 4.

Although one RF component 116 is shown in FIG. 4D, it will be understood that two or more RF components can be included within an RF isolation volume resulting from the RF isolation structure 2. According to some embodiments, the packaged module 1 can include two or more RF components each having a dedicated RF isolation structure.

Figure 5A:
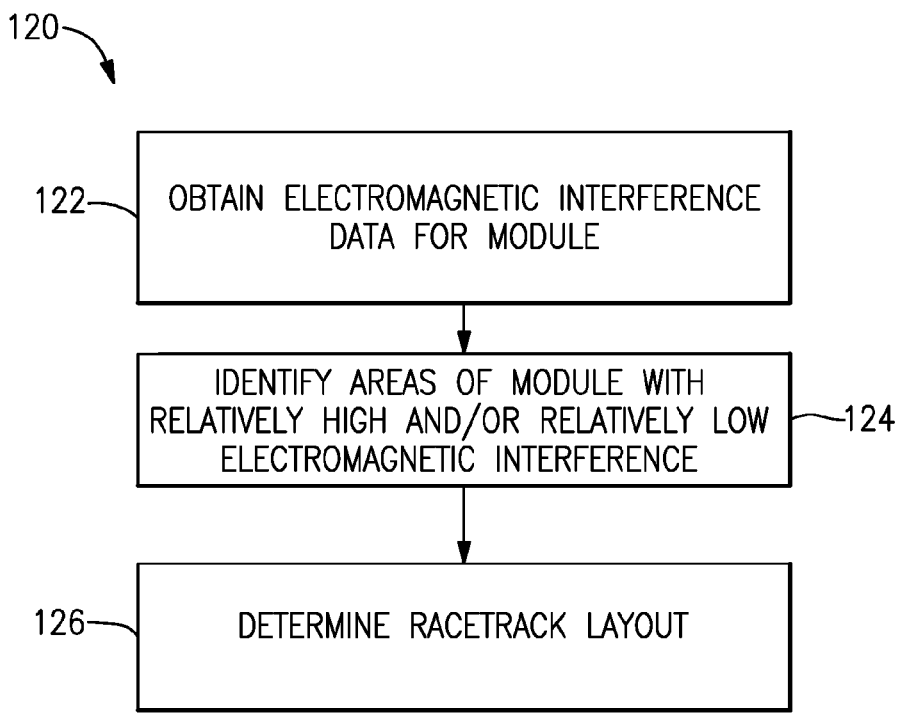
FIG. 5A is a flow diagram of an illustrative process of determining a racetrack layout according to an embodiment.

FIG. 5A is a flow diagram of an illustrative process 120 of determining a racetrack layout. Any combination of the features of the process 120 or any of the other processes described herein can be embodied in a non-transitory computer readable medium and stored in memory. When executed by one or more processors, the non-transitory computer readable medium can cause some or all of the process 120 and/or other processes to be performed. It will be understood that any of the methods discussed herein may include greater or fewer operations. It will also be understood that any of the methods discussed herein may include operations performed in any order, as appropriate.

The process 120 can determine a layout of a racetrack along the periphery of a packaged module. The racetrack can be part of an RF isolation structure that forms an RF isolation volume about one or more RF components of the packaged module. The racetrack can be configured at a ground potential. The racetrack can be formed in one layer or more layers of a substrate. In some embodiments, the racetrack can be part of a printed circuit board under an RF component, for example, as shown in FIG. 1B.

The width of the racetrack can be non-uniform. Having a narrower and/or wider racetrack in a selected defined area about the perimeter of a packaged module can tailor the RF isolation structure to the particular needs of the packaged module. A narrower section of a racetrack and/or a break in the racetrack can be included in one or more low radiating areas of the packaged module. Alternatively or additionally, a wider section of racetrack can be included in a hot spot of the packaged module. The process 120 can determine one or more selected areas of a packaged module where a section of the racetrack can be widened, narrowed, include a break, or any combination thereof. Customizing the racetrack layout with the process 120 can reduce the overall area of the packaged module without significantly effecting electromagnetic interference (EMI) performance of the packaged module.

The process 120 can include obtaining EMI data for a module at block 122, identifying areas of the module associated with relatively high EMI and/or relatively low EMI at block 124, and determining a racetrack layout at block 126. This process can be iterated any suitable number of times to achieve a desired EMI performance.

EMI data can be obtained for a module at block 122. In some embodiments, an electromagnetic scan/probe can be performed to obtain the EMI data. For instance, a near field scan can be performed. The EMI data can be associated with RF applications. According to certain embodiments, the EMI data can correspond to two or more modes of operation of an RF component of the module. For example, the EMI data can correspond to a high band mode of operation and a low band mode of operation, in which the RF component operates within a lower frequency band in the low band mode than in the high band mode of operation. Different RF isolation considerations may apply to different frequency bands of operation. For example, at higher frequencies, RF signals can have smaller wavelengths. It can be desirable to have a wider racetrack section and/or a racetrack section without a break near high band portions of the module. As another example of different modes of operation, the EMI data can correspond to a low power mode of operation and a high power mode of operation.

The EMI data can correspond to any suitable module configuration. For instance, the EMI data can correspond to an unshielded module without an RF isolation structure. As another example, the EMI data can correspond to a module with one or more racetracks having a uniform width. In certain implementations, the EMI data can correspond to a module having a racetrack with a maximum racetrack width that can be included in the module. According to some other implementations, the EMI data can correspond to a module having a racetrack with a minimum width of a particular metal layer of the substrate in which the racetrack is included. In another example, the EMI data can correspond to a module having a non-uniform racetrack with one or more breaks, one or more selected portions narrower, one or more selected portions widened, or any combination thereof.

Areas associated with relatively high and/or relatively low EMI can be identified at block 124. For instance, an area of a module associated with a lowest EMI value can be identified. The area with the lowest EMI value can be classified as a low radiating area. As another example, one or more areas of the module associated with an EMI value below a predefined lower threshold can be identified. An area of the module with an EMI value below the predefined lower threshold can be classified as a low radiating area. Alternatively or additionally, one or more areas of a module associated with an EMI value above a predefined upper threshold can be identified. An area of the module with an EMI value above the predefined upper threshold can be classified as a hot spot. In yet another example, an area of the module having the highest EMI value can be identified. Such an area can be classified as a hot spot.

Areas of the module associated with relatively high EMI can benefit by stronger RF isolation compared to other areas of the module. In some implementations, an area of the module associated with relatively high EMI can be a hot spot and/or an area for which the RF isolation structure provides less RF isolation than other areas of the module. Such areas can provide less RF isolation than defined in product specifications and/or than desired in a particular area. According to some embodiments, hot spots can occur at or near areas of a module that generate signals with a high power level, such as an output of a power amplifier (PA) or at an input of a low noise amplifier (LNA). Alternatively or additionally, hot spots can occur at or near areas of a packaged module with a high activity factor, such as an oscillator (for example, a voltage-controlled oscillator) and/or an LNA.

Areas of the module associated with relatively low EMI can provide a sufficient level of RF isolation at or near a break in the racetrack and/or with a relatively thin section of the racetrack. In some implementations, an area of the module associated with relatively low EMI can be a low radiating area and/or an area for which the RF isolation structure provides more RF isolation than other areas of the packaged module. Such areas can provide more RF isolation than defined in product specifications and/or than desired in a particular application. In a low radiating area, no signals or only signals with a low power level may be generated. According to some embodiments, a low radiating area can occur at or near areas of a module through which no signals propagate or through which signals having only a low power level propagate. Alternatively or additionally, low radiating areas can occur at or near areas of a packaged module with a low activity factor.

An RF isolation structure that includes one or more racetracks can be grounded by a connection to a ground plane, for example, by an electrical connection to a lower conductive layer below an RF component that is configured as a ground plane. The ground plane can be included in the module. While the ground plane ideally has a parasitic inductance of zero, in reality, the ground plane has a non-zero parasitic inductance. Widening a section of the racetrack can reduce an inductance associated with the ground plane. For instance, experimental data indicate that a racetrack with a uniform width of 140 microns improved EMI performance by about 2 dBm in certain areas of a module compared to a racetrack with a uniform width of 60 micron in the module. Conversely, narrowing and/or removing a section of the racetrack can increase the inductance of the ground plane. In one or more selected areas of the packaged module, such as low radiating areas, the racetrack can have a break and/or be thinned relative to other portions of the racetrack without causing significant effects in the performance of the RF isolation structure.

Higher inductance associated with the ground plane can lead to a less stable RF isolation structure that can affect signals generated by an RF component being isolated by the RF isolation structure. For example, the RF isolation structure can function like an antenna when having a relatively weak connection to the ground plane. This can cause the RF isolation structure to amplify radiation, rather than provide RF isolation. Such an affect can occur at locations of a module corresponding to relatively high EMI. When the racetrack is too thin in a section and/or includes too large of a break, the RF isolation structure can float due to a weak ground connection. The weak ground connection can cause portions of the module to be associated with relatively high EMI. Thus, it can be desirable to widen the racetrack in the portions of the racetrack associated with relatively high EMI relative to other portions of the racetrack.

At an upper threshold width, widening the racetrack may not significantly improve RF isolation. Above the upper threshold width, advantages of widening the racetrack may not provide a significant decrease in radiated power and consequently RF isolation of the RF isolation structure. As a result, it can be desirable for the racetrack width to be below the upper threshold width for particular areas and above the point at which the RF isolation structure starts to float due to a weak ground connection. In such a racetrack layout, the racetrack can also include one or more breaks and/or one or more sections that are narrowed in selected areas without noticeably impacting RF isolation performance of the RF isolation structure. These concepts can be used to identify a racetrack layout tailored to the particular RF isolation needs of a module. In certain embodiments, a racetrack can have approximately a minimum width for satisfying electromagnetic interference requirements of the packaged component, in which the width of the racetrack is non-uniform.

With continued reference to FIG. 5A, a racetrack layout can be determined at block 126. In the racetrack layout, the width of the racetrack in areas associated with high EMI can be greater than the width of the racetrack in areas associated with low EMI. For instance, as shown in FIGS. 6B, 6C, and 6F, the racetrack 7 can have one or more breaks 145 in areas associated with low EMI. As another example, as shown in FIGS. 6D, 6E, and 6F, the racetrack 7 can have one or more narrowed sections 150 in areas associated with low EMI. In the determined racetrack layout, the racetrack width can be sufficiently wide such that the RF isolation structure does not behave like a weak ground plane and below an upper threshold above which increased racetrack width should not significantly improve RF isolation. Additionally, the determined racetrack layout can include at least one break and/or narrowed section, for example, as illustrated in FIGS. 6B to 6G.

By executing the process 120, racetrack layout can be determined such that EMI associated with a packaged module meets a specification without using excess area and conductive material for the racetrack. Accordingly, the process 120 can result in a packaged module with a racetrack configured to provide RF isolation with efficient utilization of die area.

Figure 5B:
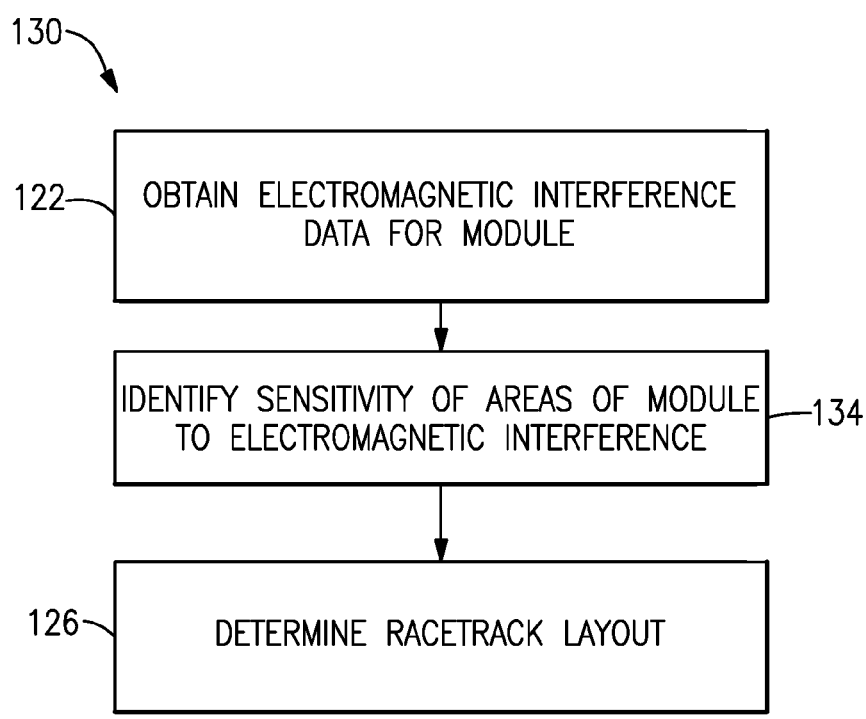
FIG. 5B is a flow diagram of an illustrative process of determining a racetrack layout according to another embodiment.

FIG. 5B is a flow diagram of an illustrative process 130 of determining a racetrack layout. The process 130 can be substantially the same as the process 120, except that block 124 of the process 120 is replaced with block 134 in the process 130 and at block 126 racetrack layout can be determined based on block 134. Thus, the process 130 can include any combination of features described earlier with reference to obtaining EMI data at block 122 and/or determining a racetrack layout at block 126. The process 130 can include obtaining EMI data at block 122, determining sensitivity of areas of a module to external radiation at block 134, and determining a racetrack layout at block 126. The process 130 can be iterated any suitable number of times. It will be understood that, according to certain embodiments, the process 120 and the process 130 can be performed together, in serial, in parallel, or any combination thereof. Thus, determined racetrack layouts can be based on a relative level of EMI associated with area(s) of a module and/or a sensitivity of the area(s) of the module to external radiation.

The principles and advantages described in connection with areas of a packaged module associated with relatively low and/or relatively high EMI can be applied to areas of the packaged module that area relatively sensitive and/or relatively insensitive to external radiation at block 134. For instance, sensitivity data can be obtained and areas that are relatively more sensitive to electromagnetic radiation and/or areas that are relatively less sensitive to electromagnetic radiation can be identified. In some embodiments, the sensitivity data can include EMI data and/or data derived from such EMI data. Areas of the packaged module that are sensitive to external radiation can be treated similarly to areas of the packaged module associated with relatively high EMI. For instance, at block 126, the racetrack can be widened in areas that are identified as being sensitive to external radiation at block 134. Alternatively or additionally, areas of the packaged module that are not sensitive to external radiation can be treated similarly to areas of the packaged module associated with relatively low EMI. For instance, at block 126, a break can be added to the racetrack and/or the racetrack can be narrowed in areas that are identified as being insensitive to external radiation at block 134. Areas that are sensitive to external radiation can include, for example, outputs of the module. For instance, an output matching network (OMN) area of a power amplifier module and/or an output of a VCO can be relatively sensitive to external radiation. By contrast, areas that are not sensitive to external radiation can include, for example, input areas and/or DC paths.

For illustrative purposes, more detail will be provided with reference to including breaks in the racetrack in selected areas and/or narrowing the racetrack in selected sections along the periphery of a substrate. Although narrowing and/or including a break in the racetrack is described for illustrative purposes, one or more features described herein can be applied to widening the racetrack in one or more selected areas.

FIGS. 6A to 6G show cross sections of racetrack layouts in a substrate along the line 140-140 in FIG. 1B in accordance with certain embodiments. One or more features of the illustrated racetrack layouts can be applied to one or more racetracks in different layers of a substrate. The illustrated racetrack layouts can be determined in accordance with the process 120 and/or the process 130 in some embodiments.

As illustrated in FIGS. 6A to 6G, the racetrack 7 is a conductive feature formed in the substrate that is configured at a ground potential. As illustrated, the racetrack 7 is disposed along the perimeter of the packed module 1 in the substrate. The racetrack 7 can be part of the RF isolation structure that provides an RF isolation volume about the RF component of the packaged module 1. The racetrack 7 can be low loss conductive material with a high conductivity, for example, copper, gold, or silver. For instance, in certain implementations, the racetrack 7 is copper.

Figure 6A:
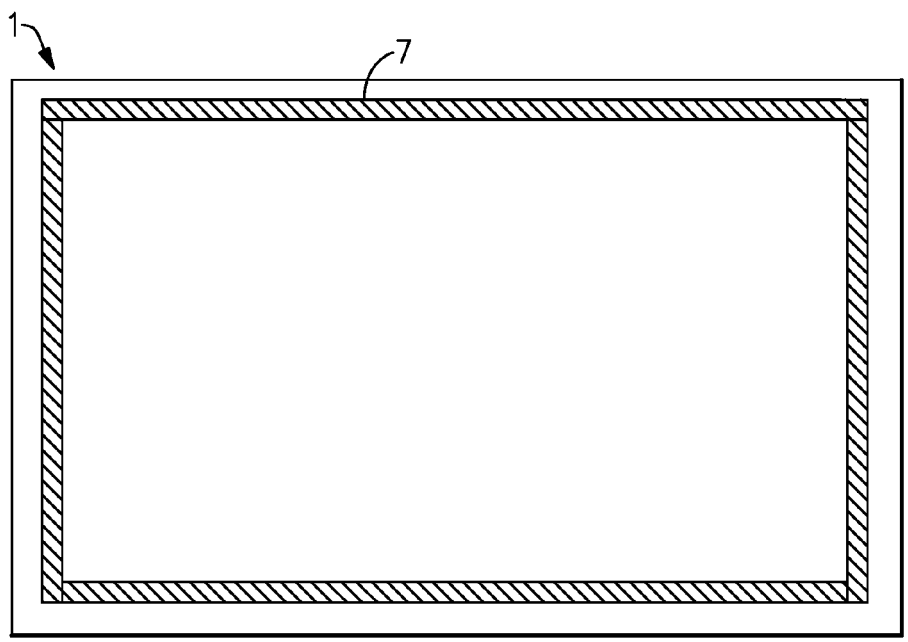
FIGS. 6A to 6G show cross sections of racetrack layouts in a substrate along the line 140-140 in FIG. 1B in accordance with certain embodiments.
Figure 6B:
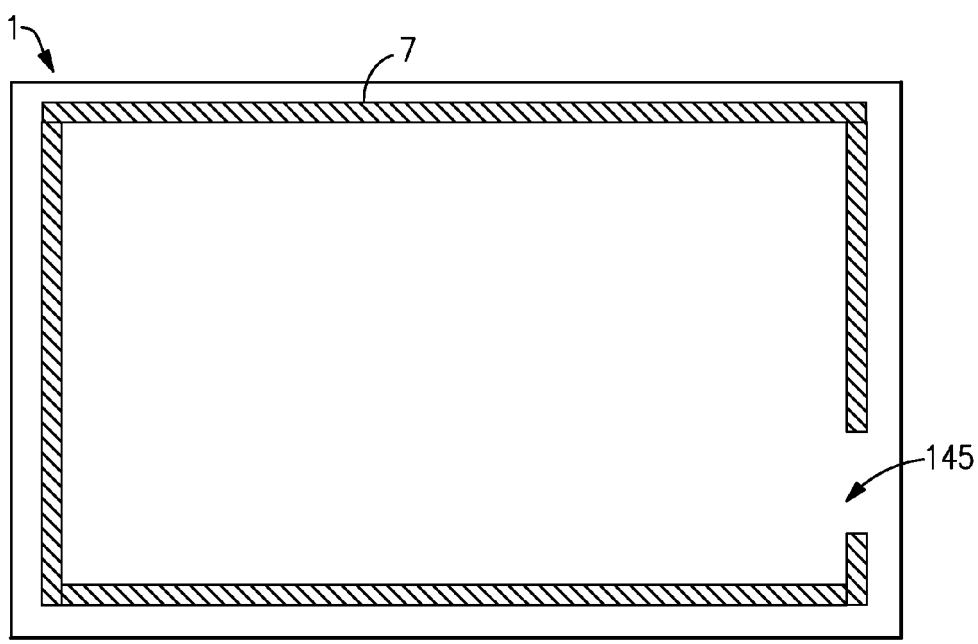
Figure 6C:
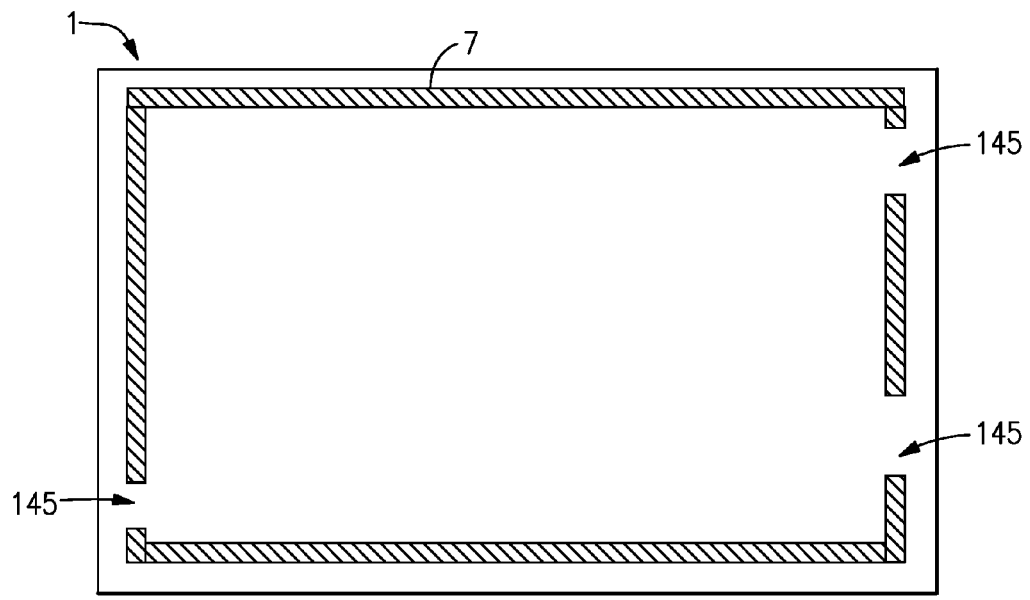
Figure 6D:
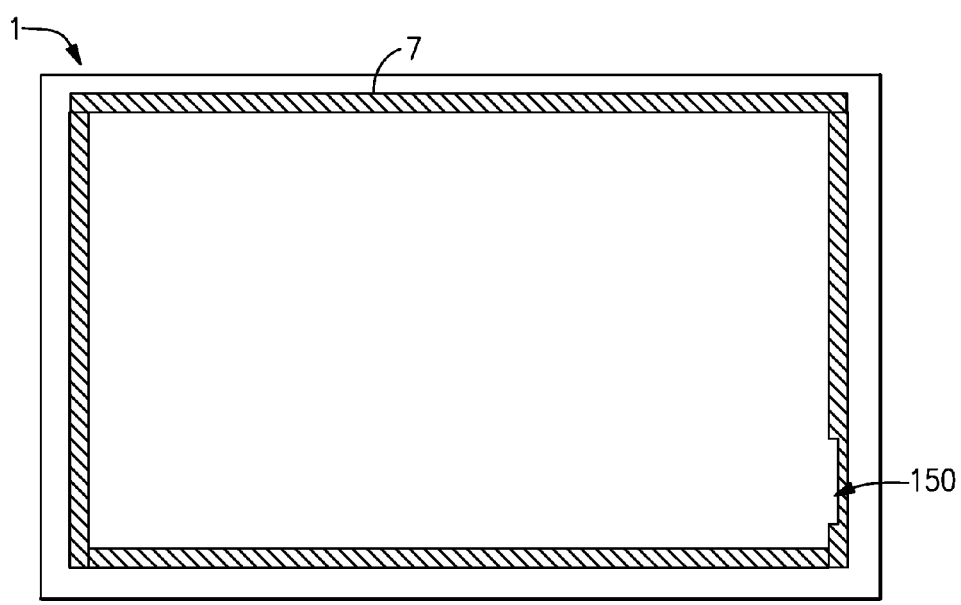
Figure 6E:
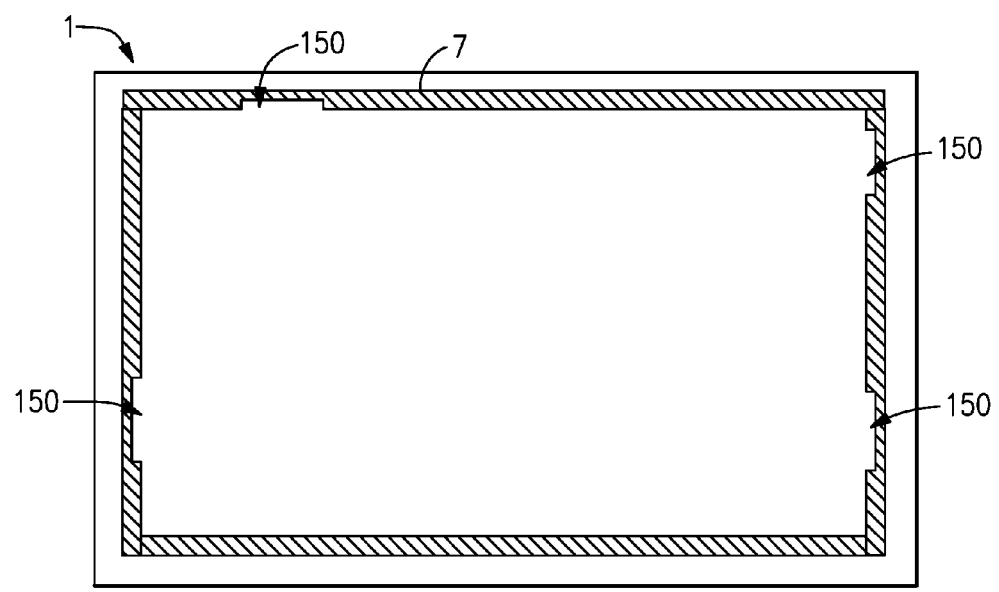
Figure 6F:
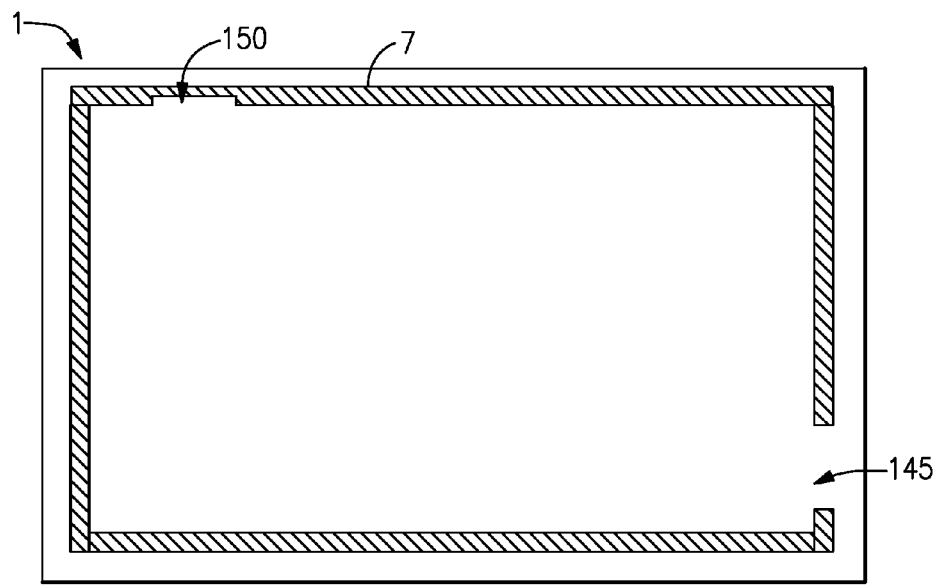

FIG. 6A shows a top plan view of a cross section of the packaged module 1 along the line 140-140 of FIG. 1B. As shown in FIG. 6A, the racetrack 7 can have a uniform width. In accordance with the principles and advantages described herein, the racetrack 7 shown in FIG. 6A can have approximately a minimum width required to meet a specification and/or provide a desired level of RF isolation.

FIG. 6B shows a top plan view of a cross section of the packaged module 1 along the line 140-140 of FIG. 1B according to an embodiment. The racetrack 7 shown in FIG. 6B has a break 145. According to certain implementations, the break 145 can be included in a low radiating area of the packaged module 1. For instance, the break 145 can be in an area of the packaged module 1 with a low activity factor. The break 145 can be included at an area of the packaged module 1 associated with a lowest EMI value in the EMI data for the packaged module 1. In some implementations, the break 145 can be included at an area of the packaged module 1 that is relatively insensitive to external radiation.

FIG. 6C shows top plan view of a cross section of the packaged module 1 along the line 140-140 of FIG. 1B according to another embodiment. The racetrack 7 can have a plurality of breaks in certain embodiments. For instance, as shown in FIG. 6C, the racetrack 7 has three breaks 145. The racetrack 7 can include two or more breaks 145 of substantially the same length. Alternatively or additionally, the racetrack 7 can include two or more breaks 145 of different lengths. The breaks 145 can be disposed at low radiating areas of the packaged module 1 and/or at areas of the packaged module that are relatively insensitive to external radiation.

FIGS. 6D and 6E show other top plan views of a cross section of the packaged module 1 along the line 140-140 of FIG. 1B according to certain embodiments. Narrowed sections 150 can be disposed at low radiating areas of the packaged module 1 and/or at areas of the packaged module that are relatively insensitive to external radiation. As shown in FIG. 6D, the racetrack 7 can include a narrowed section 150. As shown in FIG. 6E, the racetrack 7 can include a plurality of narrowed sections 150. For instance, the racetrack 7 can include two or more narrowed sections 150 of substantially the same length. Alternatively or additionally, the racetrack 7 can include two or more narrowed sections 150 of different lengths. The narrowed sections 150 can be thinned on an inner edge facing the RF component. This can provide additional area for other features to be included in the substrate in the same layer as the racetrack 7. In certain embodiments, the racetrack 7 can have a width of approximately a minimum width of metal layers in a particular layer of the substrate in a narrowed section 150. The minimum width of a metal layer in a particular layer of the substrate can be for example, about 30 um to about 60 um.

FIG. 6F shows another top plan view of a cross section of the packaged module 1 along the line 140-140 of FIG. 1B according to another embodiment. As shown in FIG. 6F, the racetrack 7 can include a break 145 and a narrowed section 150. The racetrack 7 can include two or more breaks 145 and one or more narrowed sections 150. The racetrack 7 can include one or more breaks 145 and two or more narrowed sections 150.

Figure 6G:
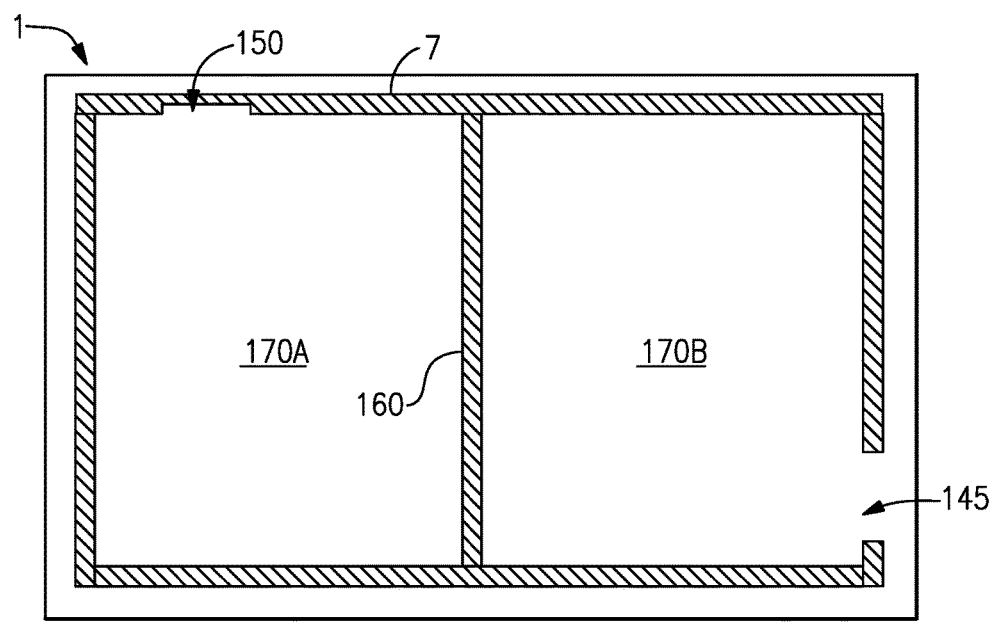

FIG. 6G shows a top plan view of a cross section of the packaged module 1 along the line 140-140 of FIG. 1B according to yet another embodiment. As shown in FIG. 6G, the racetrack 7 can include a conductive line 160 that divides areas of the packaged module 1 into separate RF isolation areas. For instance, the conductive line 160 can divide the packaged module 1 into a first RF isolation area 170a and a second RF isolation area 170b. Different circuitry can be disposed in the separate isolation areas. In one example, a power amplifier can be in the first RF isolation area 170a and one or more filters can be in the second RF isolation area 170b. As another example, the high band portion 3 of FIG. 1A can be in the first RF isolation area 170a and the low band portion 4 of FIG. 1A can be in the second RF isolation area 170b. While FIG. 6G shows the conductive line 160 dividing the packaged module 1 into two separate RF isolation areas, it will be understood that the packaged module 1 can be divided into more than two separate RF isolation areas in accordance with the principles and advantages described herein. As illustrated, the conductive line 160 divides the packaged module 1 into separate RF isolation areas of approximately the same size. In other implementations, the separate isolation areas can have different sizes from each other. Conductive features, such as wirebonds, can provide at least a portion of an electrical connection between the conductive line 160 and a conductive layer disposed over the first RF portion and/or the second RF portion. The conductive line 160 can increase the stability of the racetrack 7 being at a ground potential. The conductive line 160 can have approximately the same width as the outer portion of the racetrack 7. The conductive line 160 can be implemented in accordance with any of principles and advantages of the racetracks 7 described herein.

Packaged modules in accordance with one or more features described herein can include particular racetrack layouts. For instance, the racetrack can be wider in a first area of the packaged module associated with a higher EMI than in a second area of the packaged module associated with a lower EMI. For instance, as shown in FIGS. 6B to 6E, a break 145 or a narrowed section 150 can be included in the second area and the first area can have a greater racetrack width. As another example, the racetrack can be widened in the first area compared to the second area.

The first area can correspond to a hot spot of the packaged module and the second area can correspond to a low radiating area of the packaged module. For example, the hotspot can be adjacent to a power amplifier output or an output of a different RF component that generates a high power signal. As another example, the hotspot can be adjacent to a voltage-controlled oscillator output or an output of a different RF component that has a high activity factor. By contrast, the second area can be adjacent to an area of the packaged module with a low activity factor, an area of the packaged module that does not generate signals, an area of the packaged module in which low power signal propagate, the like, or any combination thereof. The racetrack can include one or more breaks 145 and/or one or more narrowed sections 150 in low radiating areas of a packaged module.

A hotspot in the first area and/or a low radiating area in the second area can result from the RF component of the packaged module. For instance, one or more RF components being isolated by the RF isolation structure can emit more radiation to the first area than to the second area.

Alternatively or additionally, the first area can be exposed to more external radiation than the second area. For instance, a hot spot of an adjacent component could be adjacent to the first area. The racetrack can include one or more breaks 145 and/or one or more narrowed sections 150 in areas of a packaged module that are relatively insensitive to external radiation.

The racetrack layouts described herein can be included in an RF isolation structure of a packaged module that includes one or more conductive features forming at least a portion of an electrical connection between the racetrack and a conductive layer above the RF component. As one example, the one or more conductive features can include wirebonds, for example, the wirebonds 51 illustrated in FIG. 1B. Alternatively, the one or more conductive features can include a metal can surrounding the RF component.

In certain embodiments, the RF component within the RF isolation volume formed by the RF isolation structure includes a power amplifier. For instance, the racetrack layouts illustrated in FIGS. 6A to 6G can correspond to the packaged module illustrated in FIGS. 1A and 1B.

Some of the embodiments described above have provided examples in connection with packaged modules and/or electronic devices that include RF components, such as power amplifiers. However, the principles and advantages of the embodiments can be used for any other systems or apparatus that have needs for a shielding and/or isolation.

Systems implementing one or more aspects of this disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, an RF receiving device, an RF transceiver, any portable device having an RF component (for example, a power amplifier), a mobile phone (for example, a smart phone), a telephone, a base station, a femtocell, a radar, a device configured to communicate according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, the like, etc. Part of the consumer electronic products can include a multi-chip module including an RF isolation structure, a power amplifier module, an integrated circuit including an RF isolation structure, a substrate including vias that can be used to form part of an RF isolation structure, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device comprising:
   an antenna configured to facilitate at least one of transmitting or receiving a radio-frequency signal;
   a packaged module in communication with the antenna, the packaged module including a substrate configured to receive a plurality of components; a radio frequency component coupled to a major surface of the substrate; a racetrack in the substrate, the racetrack configured at a ground potential, the racetrack including a continuous portion along a periphery of the packaged module, the continuous portion including a first part and a second part that extends in a direction substantially orthogonal to the first part, and the racetrack having a narrowed section that has a width that is narrower than other portions of the racetrack, the narrowed section of the racetrack being located in a low radiating area that is associated with less electromagnetic radiation than the other portions of the racetrack; a conductive layer electrically connected to the racetrack such that the racetrack and the conductive layer form at least a portion of a radio frequency isolation structure around the radio frequency component, the radio frequency component being positioned between the major surface of the substrate and the conductive layer; a wirebond pad and a wirebond in contact with the conductive layer and the wirebond pad;
   and a via in the substrate, the via being disposed between the racetrack and the major surface, and the via being in an electrical path between the racetrack and the wirebond pad; and
   an other electronic module in communication with the packaged module.

2. The wireless device of claim 1 wherein the packaged module further includes a second racetrack electrically connected to the racetrack by the via.

3. The wireless device of claim 1 wherein the radio frequency component is configured to emit less electromagnetic radiation to the low radiating area of the packaged module than to other areas of the packaged module.

4. The wireless device of claim 1 wherein the packaged module is configured to receive less electromagnetic radiation at the low radiating area of the packaged module from the other electronic module than at other areas of the packaged module.

5. The wireless device of claim 1 wherein the racetrack has at least one break.

6. The wireless device of claim 1 wherein the radio frequency component includes a high band portion and a low band portion.

7. The wireless device of claim 1 wherein the radio frequency component includes a power amplifier.

8. A packaged module comprising:
   a radio frequency component coupled to a major surface of a substrate;
   a racetrack in the substrate, the racetrack configured at a ground potential, and the racetrack having a section that has a break or a width that is narrower than other portions of the racetrack, the section that has the break or width that is narrower being located in a low radiating area that is associated with less electromagnetic radiation than the other portions of the racetrack;
   a wirebond pad bonded to a wirebond;
   a via in the substrate, the via being positioned between the racetrack and the wirebond pad, and the via being in an electrical path between the racetrack and the wirebond pad; and
   a conductive layer electrically connected to the wirebond pad by the wirebond such that the racetrack, the wirebond, the via, and the conductive layer form at least a portion of a radio frequency isolation structure around the radio frequency component, the radio frequency component being positioned between the major surface of the substrate and the conductive layer.

9. The packaged module of claim 8 wherein the radio frequency component includes a power amplifier.

10. The packaged module of claim 8 wherein the section of the racetrack has the break.

11. The packaged module of claim 10 wherein the racetrack has at least a second break.

12. The packaged module of claim 10 wherein the racetrack has another section that has a width that is narrower than other portions of the racetrack.

13. The packaged module of claim 8 further comprising two additional racetracks disposed in different respective layers of the substrate, the two additional racetracks being electrically connected to the racetrack.

14. The packaged module of claim 8 wherein the radio frequency component includes a high band portion and a low band portion.

15. A packaged module comprising:
a radio frequency component coupled to a major surface of a substrate;
a racetrack in the substrate, the racetrack configured at a ground potential, the racetrack including a continuous portion along a periphery of the packaged module, the continuous portion including a first part and a second part that extends in a direction substantially orthogonal to the first part, the racetrack having a narrowed section that has a width that is narrower than other portions of the racetrack, and the narrowed section of the racetrack being located in a low radiating area that is associated with less electromagnetic radiation than the other portions of the racetrack;
a conductive layer electrically connected to the racetrack such that the racetrack and the conductive layer form at least a portion of a radio frequency isolation structure around the radio frequency component, the radio frequency component being positioned between the major surface of the substrate and the conductive layer;
a wirebond pad and a wirebond in contact with the conductive layer and the wirebond pad; and
a via in the substrate, the via being disposed between the racetrack and the major surface, and the via being in an electrical path between the racetrack and the wirebond pad.

16. The packaged module of claim 15 wherein the racetrack has at least one break.

17. The packaged module of claim 15 further comprising wirebonds configured to provide at least a portion of an electrical connection between the racetrack and the conductive layer, the wirebonds including the wirebond, and the radio frequency isolation structure including the wirebonds.

18. The packaged module of claim 15 wherein the radio frequency component includes a high band portion and a low band portion.

19. The packaged module of claim 15 further comprising a second racetrack electrically connected to the racetrack by the via.

20. The packaged module of claim 15 wherein the radio frequency component includes a power amplifier.

* * * * *